United States Patent
Kajino

(10) Patent No.: US 11,411,512 B2
(45) Date of Patent: Aug. 9, 2022

(54) CONTROL DEVICE AND METHOD FOR CONTROLLING A PIEZOELECTRIC DRIVE DEVICE USING PHASE DIFFERENCE

(71) Applicant: Seiko Epson Corporation, Tokyo (JP)

(72) Inventor: Kiichi Kajino, Matsumoto (JP)

(73) Assignee: Seiko Epson Corporation

( * ) Notice: Subject to any disclaimer, the term of this patent is extended or adjusted under 35 U.S.C. 154(b) by 978 days.

(21) Appl. No.: 16/145,331

(22) Filed: Sep. 28, 2018

(65) Prior Publication Data

US 2019/0103823 A1    Apr. 4, 2019

(30) Foreign Application Priority Data

Sep. 29, 2017    (JP) .............................. JP2017-191088

(51) Int. Cl.

| | |
|---|---|
| *H02N 2/14* | (2006.01) |
| *H02N 2/10* | (2006.01) |
| *H01L 41/04* | (2006.01) |
| *H01L 41/08* | (2006.01) |
| *G02B 7/04* | (2021.01) |
| *B41J 2/045* | (2006.01) |
| *H01L 21/677* | (2006.01) |
| *G03B 21/53* | (2006.01) |
| *G03B 21/14* | (2006.01) |

(Continued)

(52) U.S. Cl.
CPC .......... *H02N 2/147* (2013.01); *B41J 2/04541* (2013.01); *B41J 2/04581* (2013.01); *G02B 7/04* (2013.01); *G03B 21/142* (2013.01); *G03B 21/53* (2013.01); *H01L 21/67706* (2013.01); *H01L 41/042* (2013.01); *H01L 41/0825* (2013.01); *H02N 2/103* (2013.01); *H02N 2/142* (2013.01); *G03B 21/006* (2013.01); *G03B 21/2066* (2013.01)

(58) Field of Classification Search
CPC ........ H01N 2/147; H01N 2/103; H01N 2/142; H01L 21/67706; H01L 41/042; H01L 41/0825; B41J 2/04541; B41J 2/4581; G02B 7/04; G03B 21/141; G03B 21/53; G03B 21/006; G03B 21/2066
See application file for complete search history.

(56) References Cited

U.S. PATENT DOCUMENTS

| | | | | |
|---|---|---|---|---|
| 6,635,977 | B2 * | 10/2003 | Kataoka | H02N 2/142 310/317 |
| 6,954,022 | B2 * | 10/2005 | Kataoka | H02N 2/142 310/317 |
| 2003/0052628 | A1 | 3/2003 | Kataoka | |

FOREIGN PATENT DOCUMENTS

JP    2003-092891 A    3/2003

* cited by examiner

*Primary Examiner* — Emily P Pham
(74) *Attorney, Agent, or Firm* — Harness, Dickey & Pierce, P.L.C.

(57) ABSTRACT

A control device of a piezoelectric drive device includes a drive pulse signal generation unit that generates a binary drive pulse signal, a drive signal generation unit that generates a drive signal which is applied to the piezoelectric element for drive from the drive pulse signal, a detection pulse signal generation unit that generates a detection pulse signal by binarizing the detection signal which is output from the piezoelectric element for detection, and a phase difference acquisition unit that acquires a phase difference between the drive pulse signal and the detection pulse signal, based on a rising edge and a falling edge of the drive pulse signal and a rising edge and a falling edge of the detection pulse signal.

16 Claims, 19 Drawing Sheets

(51) Int. Cl.
*G03B 21/20* (2006.01)
*G03B 21/00* (2006.01)

CONTROL DEVICE AND METHOD FOR CONTROLLING A PIEZOELECTRIC DRIVE DEVICE USING PHASE DIFFERENCE

BACKGROUND

1. Technical Field

The present invention relates to a control device of a piezoelectric drive device and a control method of the piezoelectric drive device.

2. Related Art

For example, JP-A-2003-92891 discloses a configuration in which a piezoelectric drive device includes a vibration body, pulse control means for generating a first pulse signal which is applied to the vibration body, vibration detection means for detecting vibration of the vibration body, and a pulse signal conversion means for converting an output signal of the vibration detection means into a second pulse signal. The piezoelectric drive device having such a configuration detects a phase difference between the first pulse signal and the second pulse signal and controls the phase difference, thereby, being capable of controlling vibration of the vibration body.

Here, a method for changing a duty of the first pulse signal so as to control an amplitude of the vibration body is known. In general, when the duty is 50%, the amplitude is the largest, and as the duty approaches zero, the amplitude is reduced. As such, there is a possibility that, if the duty changes, the phase difference between the first pulse signal and the second pulse signal is shifted from an actual phase difference and a vibration state of the vibration body cannot be detected with high accuracy.

SUMMARY

An advantage of some aspects of the invention is to provide a control device of a piezoelectric drive device and a control method of a piezoelectric drive device that can detect a vibration state with high accuracy.

The advantage can be achieved by the following configuration.

A control device of a piezoelectric drive device according to an aspect of the invention includes a vibration body that includes a piezoelectric element for drive and a piezoelectric element for detection, vibrates according to drive of the piezoelectric element for drive, and outputs a detection signal according to the vibration from the piezoelectric element for detection, and includes a drive pulse signal generation unit that generates a binary drive pulse signal, a drive signal generation unit that generates a drive signal which is applied to the piezoelectric element for drive from the drive pulse signal, a detection pulse signal generation unit that generates a detection pulse signal by binarizing the detection signal which is output from the piezoelectric element for detection, and a phase difference acquisition unit that acquires a phase difference between the drive pulse signal and the detection pulse signal, based on a rising edge and a falling edge of the drive pulse signal and a rising edge and a falling edge of the detection pulse signal.

With this configuration, since a phase difference is not affected by a duty of a drive pulse signal, a vibration state of a vibration body can be detected with high accuracy regardless of the duty of the drive pulse signal. Accordingly, it is possible to control drive of a piezoelectric drive device with high accuracy.

In the control device of an piezoelectric drive device according to the aspect of the invention, it is preferable that the phase difference acquisition unit acquires the phase difference, based on a center of the rising and falling edges of the drive pulse signal and a center of the rising and falling edges of the detection pulse signal.

With this configuration, it is possible to detect a vibration state of a vibration body with high accuracy regardless of a duty of a drive pulse signal.

A control device of a piezoelectric drive device according to another aspect of the invention includes a vibration body that includes a piezoelectric element for drive and a piezoelectric element for detection, vibrates according to drive of the piezoelectric element for drive, and outputs a detection signal according to the vibration from the piezoelectric element for detection, and includes a drive pulse signal generation unit that generates a binary drive pulse signal, a drive signal generation unit that generates a drive signal which is applied to the piezoelectric element for drive from the drive pulse signal, a detection pulse signal generation unit that generates a detection pulse signal by binarizing the detection signal which is output from the piezoelectric element for detection, and a phase difference acquisition unit that acquires a phase difference between the drive pulse signal and the detection pulse signal, based on a duty of the drive pulse signal, a rising edge and a falling edge of the drive pulse signal and a rising edge and a falling edge of the detection pulse signal.

With this configuration, since a phase difference is not affected by a duty of a drive pulse signal, a vibration state of a vibration body can be detected with high accuracy regardless of the duty of the drive pulse signal. Accordingly, it is possible to control drive of a piezoelectric drive device with high accuracy.

In the control device of a piezoelectric drive device according to the aspect of the invention, it is preferable that the phase difference acquisition unit acquires the phase difference, based on a center of the rising and falling edges of the drive pulse signal that is predicted based on the duty of the drive pulse signal and the rising edge or the falling edge of the drive pulse signal, and a center of the rising and falling edges of the detection pulse signal that is predicted based on the rising edge or the falling edge of the detection pulse signal.

With this configuration, since a phase difference can be acquired in real time, it is possible to detect a vibration state of a vibration body with high accuracy.

A control device of a piezoelectric drive device according to another aspect of the invention includes a vibration body that includes a piezoelectric element for drive and a piezoelectric element for detection, vibrates according to drive of the piezoelectric element for drive, and outputs a detection signal according to the vibration from the piezoelectric element for detection, and includes a drive pulse signal generation unit that generates a binary drive pulse signal, a drive signal generation unit that generates a drive signal which is applied to the piezoelectric element for drive from the drive pulse signal, a monitor pulse signal generation unit that generates a monitor pulse signal by binarizing the drive signal, a detection pulse signal generation unit that generates a detection pulse signal by binarizing the detection signal which is output from the piezoelectric element for detection, and a phase difference acquisition unit that acquires a phase difference between the drive pulse signal and the detection pulse signal, based on a rising edge and a falling edge of the monitor pulse signal and a rising edge and a falling edge of the detection pulse signal.

With this configuration, since a phase difference is not affected by a duty of a drive pulse signal, a vibration state of a vibration body can be detected with high accuracy regardless of the duty of the drive pulse signal. Accordingly, it is possible to control drive of a piezoelectric drive device with high accuracy.

It is preferable that the control device of a piezoelectric drive device according to the aspect of the invention further includes a drive control unit that controls drive of the drive pulse signal generation unit, based on the phase difference which is acquired by the phase difference acquisition unit.

With this configuration, it is possible to adjust a phase difference to a predetermined value and to efficiently vibrate a vibration body.

A control method of a piezoelectric drive device according to another aspect of the invention includes a vibration body that includes a piezoelectric element for drive and a piezoelectric element for detection, vibrates according to drive of the piezoelectric element for drive, and outputs a detection signal according to the vibration from the piezoelectric element for detection, and includes generating a binary drive pulse signal, generating a drive signal which is applied to the piezoelectric element for drive from the drive pulse signal, generating a detection pulse signal by binarizing the detection signal which is output from the piezoelectric element for detection, and, acquiring a phase difference between the drive pulse signal and the detection pulse signal, based on a rising edge and a falling edge of the drive pulse signal and a rising edge and a falling edge of the detection pulse signal.

With this configuration, since a phase difference is not affected by a duty of a drive pulse signal, a vibration state of a vibration body can be detected with high accuracy regardless of the duty of the drive pulse signal. Accordingly, it is possible to control drive of a piezoelectric drive device with high accuracy.

In the control method of a piezoelectric drive device according to the aspect of the invention, it is preferable that the phase difference is acquired based on a center of the rising and falling edges of the drive pulse signal and a center of the rising and falling edges of the detection pulse signal.

With this configuration, it is possible to detect a vibration state of a vibration body with high accuracy regardless of a duty of a drive pulse signal.

A control method of a piezoelectric drive device according to another aspect of the invention includes a vibration body that includes a piezoelectric element for drive and a piezoelectric element for detection, vibrates according to drive of the piezoelectric element for drive, and outputs a detection signal according to the vibration from the piezoelectric element for detection, and includes generating a binary drive pulse signal, generating a drive signal which is applied to the piezoelectric element for drive from the drive pulse signal, generating a detection pulse signal by binarizing the detection signal which is output from the piezoelectric element for detection, and acquiring a phase difference between the drive pulse signal and the detection pulse signal, based on a duty of the drive pulse signal, a rising edge or a falling edge of the drive pulse signal, and a rising edge or a falling edge of the detection pulse signal.

With this configuration, since a phase difference is not affected by a duty of a drive pulse signal, a vibration state of a vibration body can be detected with high accuracy regardless of the duty of the drive pulse signal. Accordingly, it is possible to control drive of a piezoelectric drive device with high accuracy.

In the control method of a piezoelectric drive device according to the aspect of the invention, it is preferable that the phase difference is acquired based on a center of the rising and falling edges of the drive pulse signal that is predicted based on the duty of the drive pulse signal and the rising edge or the falling edge of the drive pulse signal, and a center of the rising and falling edges of the detection pulse signal that is predicted based on the rising edge or the falling edge of the detection pulse signal.

With this configuration, since a phase difference can be acquired in real time, it is possible to detect a vibration state of a vibration body with high accuracy.

A control method of a piezoelectric drive device according to another aspect of the invention includes a vibration body that includes a piezoelectric element for drive and a piezoelectric element for detection, vibrates according to drive of the piezoelectric element for drive, and outputs a detection signal according to the vibration from the piezoelectric element for detection, and includes generating a binary drive pulse signal, generating a drive signal which is applied to the piezoelectric element for drive from the drive pulse signal, generating a monitor pulse signal by binarizing the drive signal, generating a detection pulse signal by binarizing the detection signal which is output from the piezoelectric element for detection, and acquiring a phase difference between the drive pulse signal and the detection pulse signal, based on a rising edge and a falling edge of the monitor pulse signal and a rising edge and a falling edge of the detection pulse signal.

With this configuration, since a phase difference is not affected by a duty of a drive pulse signal, a vibration state of a vibration body can be detected with high accuracy regardless of the duty of the drive pulse signal. Accordingly, it is possible to control drive of a piezoelectric drive device with high accuracy.

In the control method of a piezoelectric drive device according to the aspect of the invention, it is preferable that the drive pulse signal is generated based on the phase difference.

With this configuration, it is possible to adjust a phase difference to a predetermined value and to efficiently vibrate a vibration body.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a control device of a piezoelectric drive device and a control method for the piezoelectric drive device according to the invention will be described in detail based on preferable embodiments illustrated in the accompanying drawings.

First Embodiment

First, the control device of the piezoelectric drive device and a control method for the piezoelectric drive device according to a first embodiment of the invention will be described.

Figure 1:
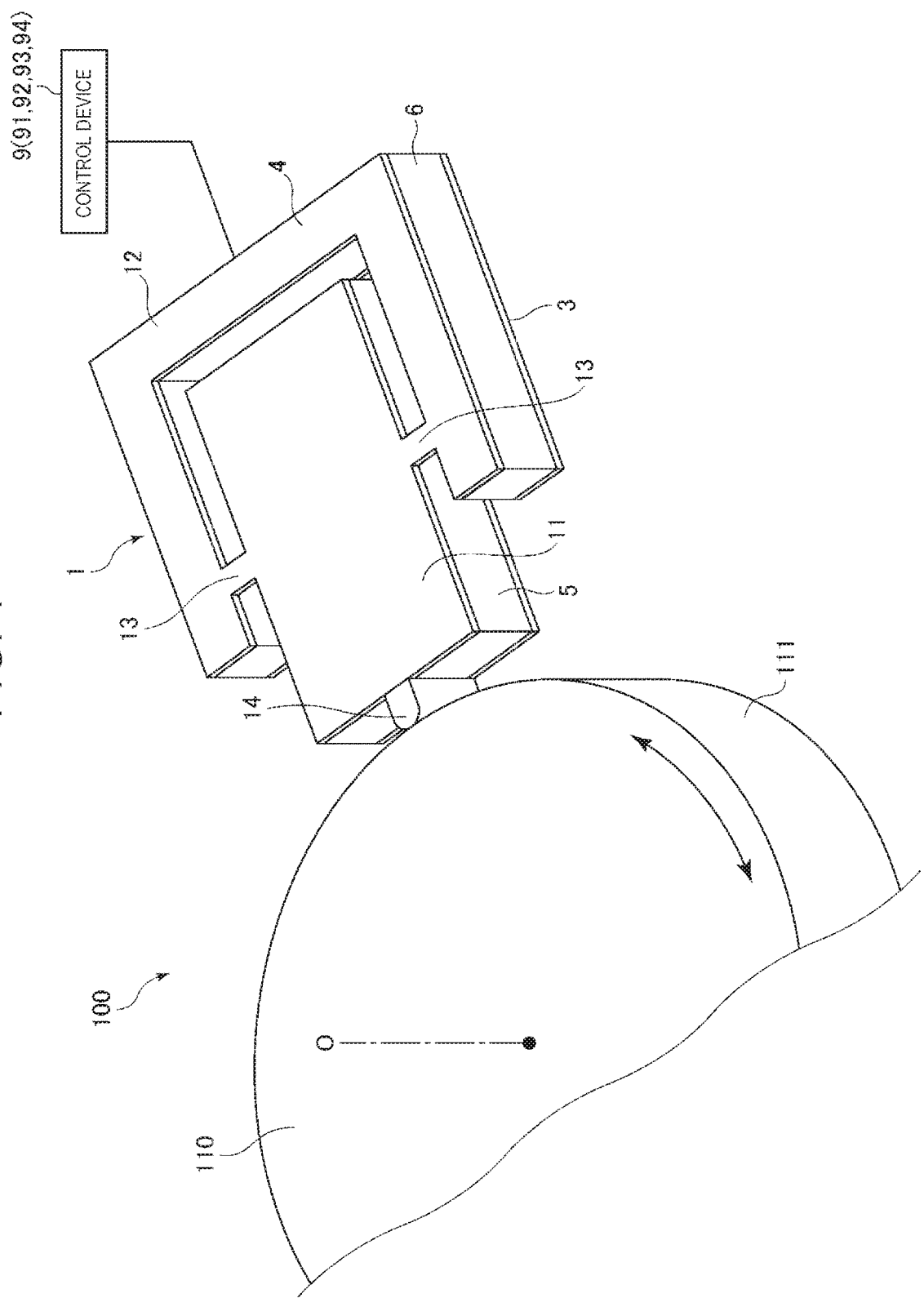
FIG. 1 is a perspective view illustrating an entire configuration of a piezoelectric motor according to a first embodiment of the invention.
Figure 2:
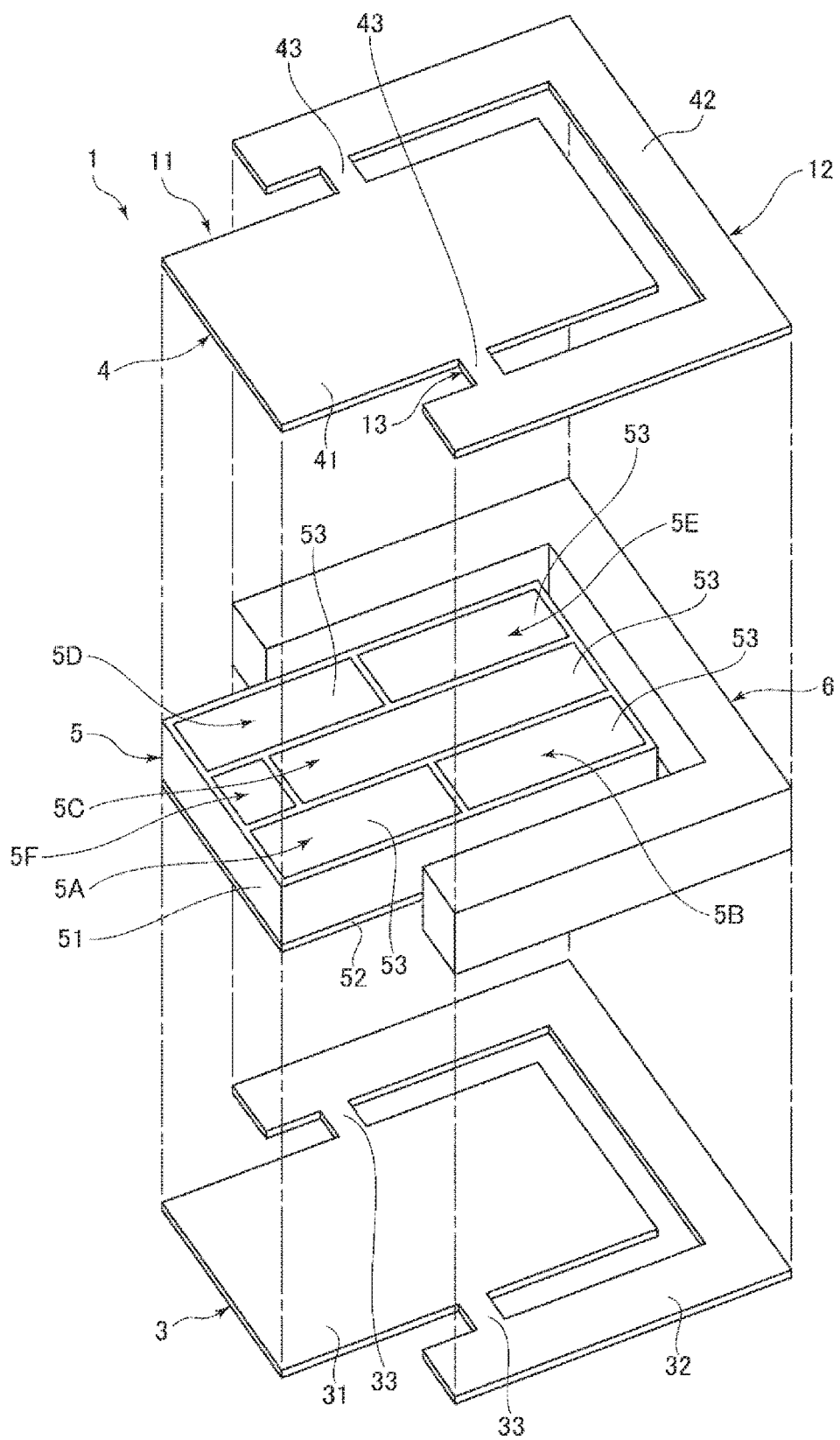
FIG. 2 is an exploded perspective view of a piezoelectric drive device illustrated in FIG. 1.
Figure 3:
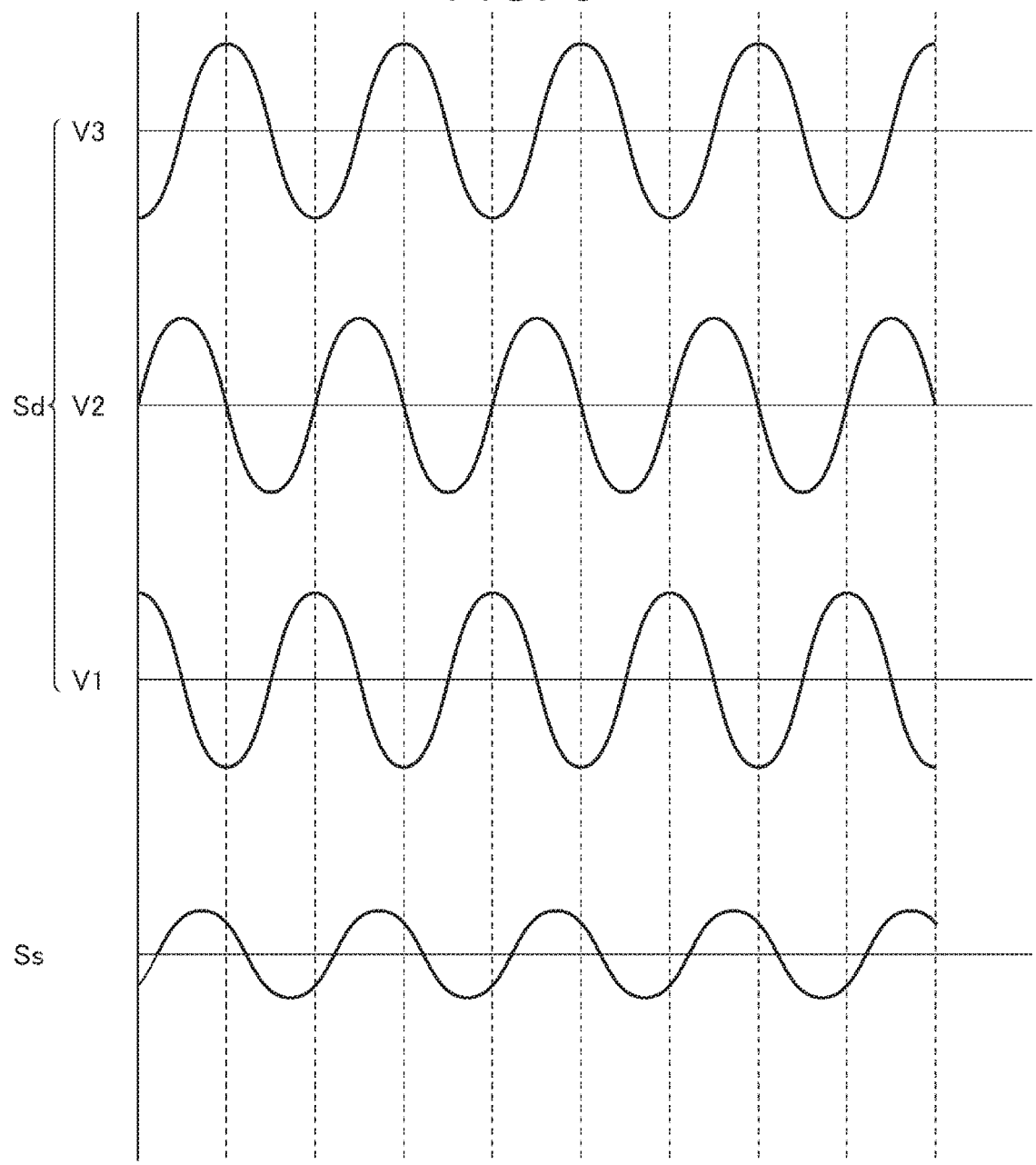
FIG. 3 is a diagram illustrating a drive signal applied to the piezoelectric drive device and a detection signal output from the piezoelectric drive device.
Figure 4:
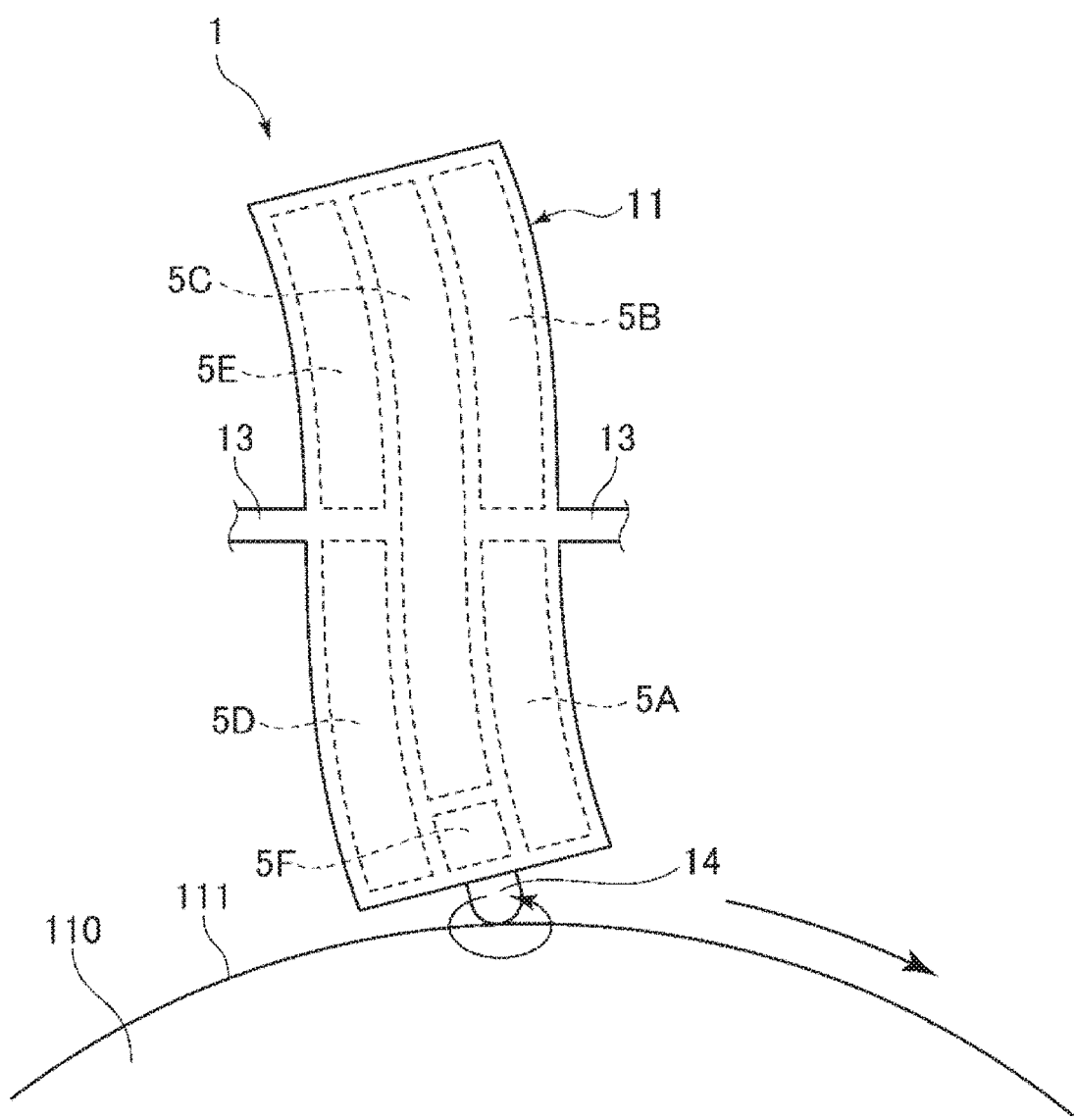
FIG. 4 is a diagram illustrating drive of the piezoelectric motor when the drive signal illustrated in FIG. 3 is applied.
Figure 5:
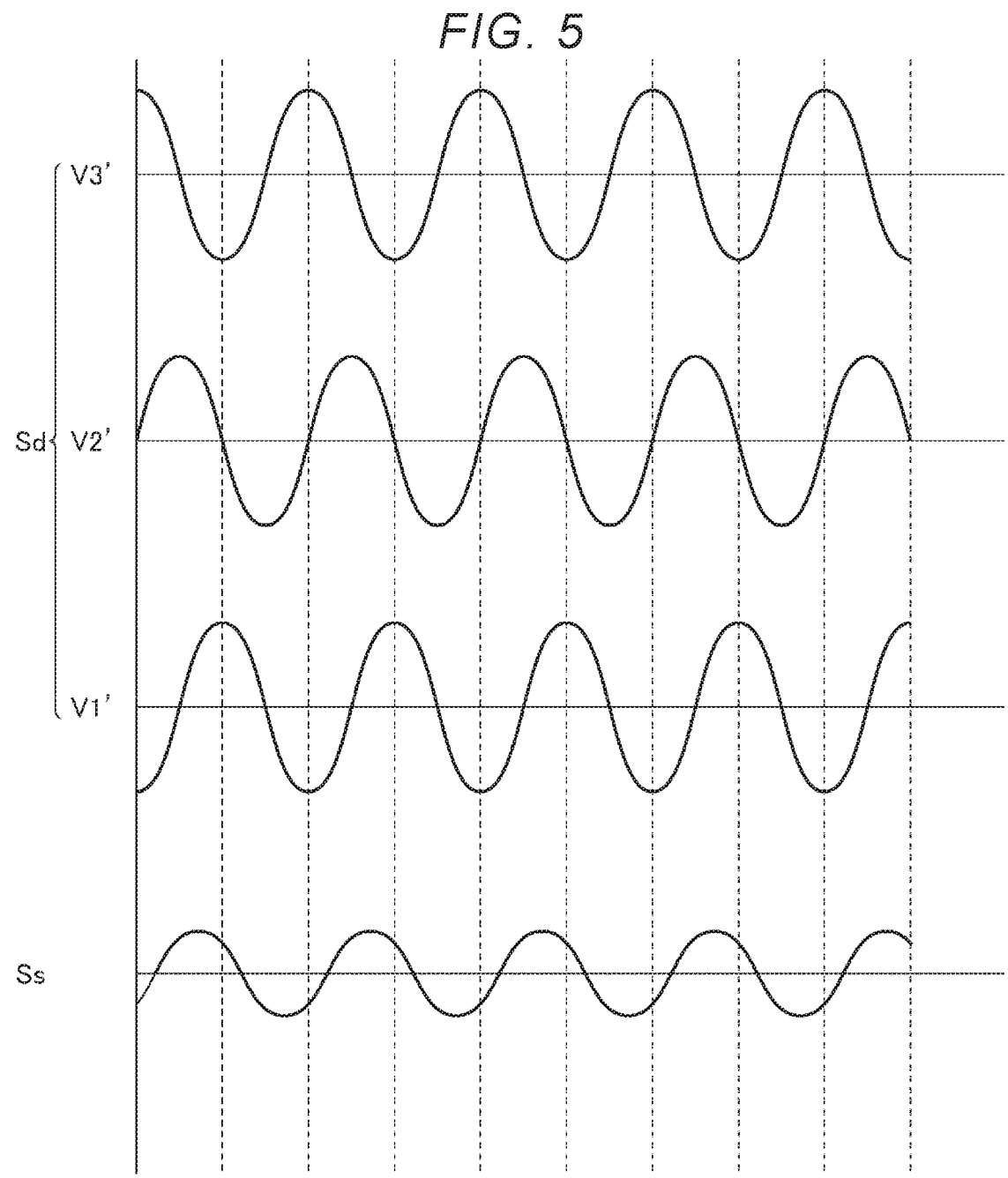
FIG. 5 is a diagram illustrating the drive signal applied to the piezoelectric drive device and the detection signal output from the piezoelectric drive device.
Figure 6:
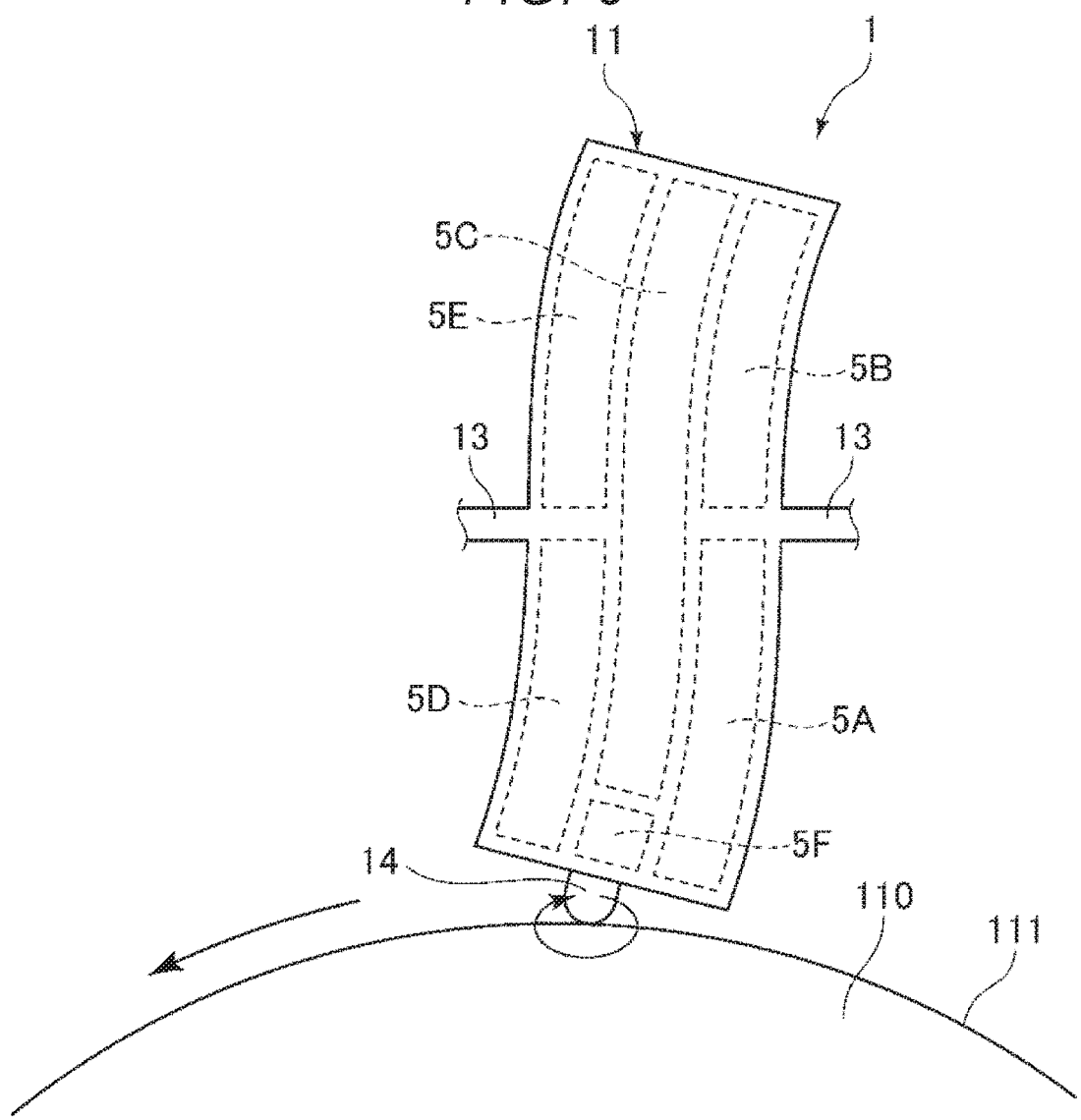
FIG. 6 is a diagram illustrating drive of the piezoelectric motor when the drive signal illustrated in FIG. 5 is applied.
Figure 7:
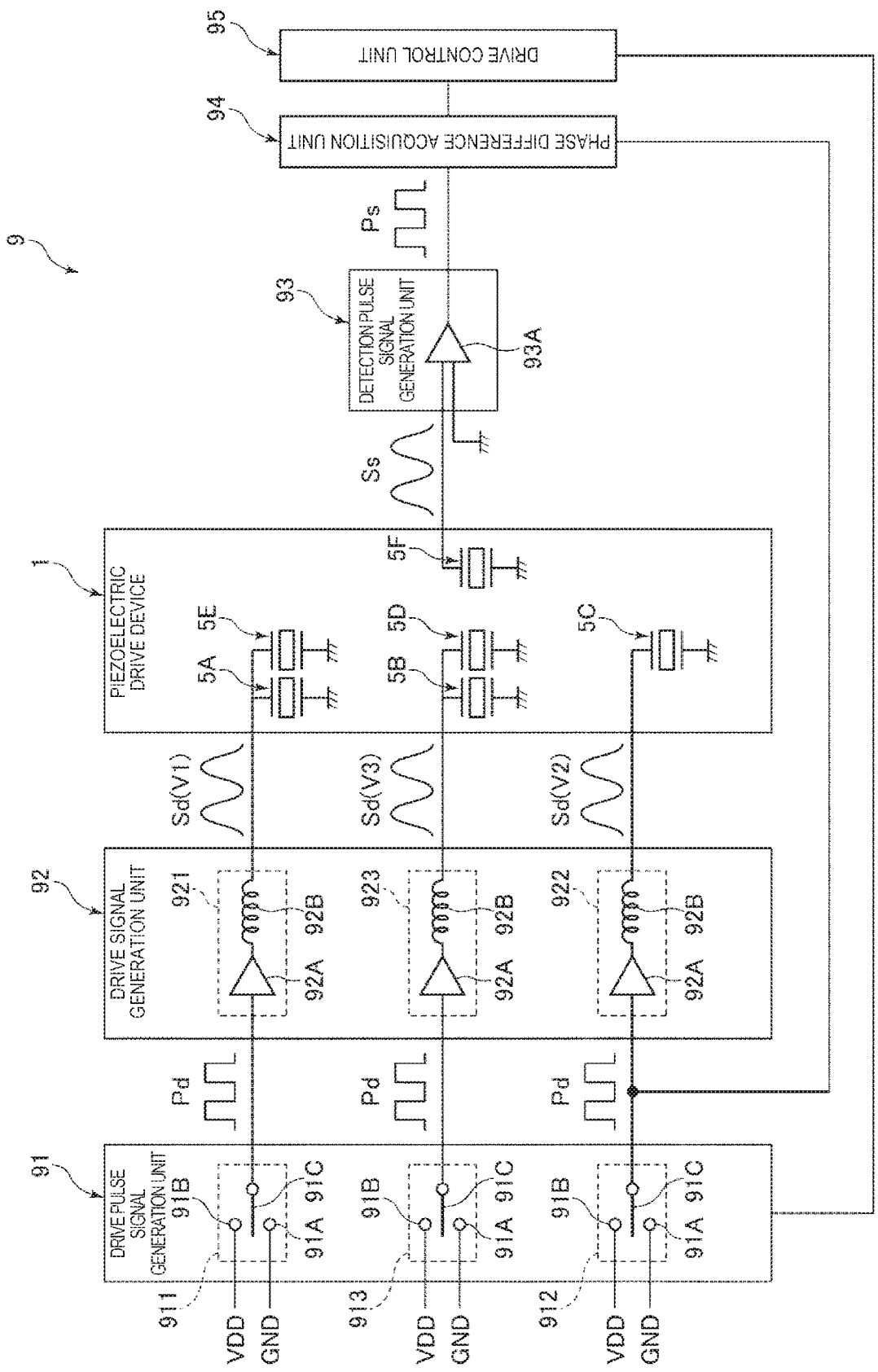
FIG. 7 is a circuit diagram illustrating a control device.
Figure 8:
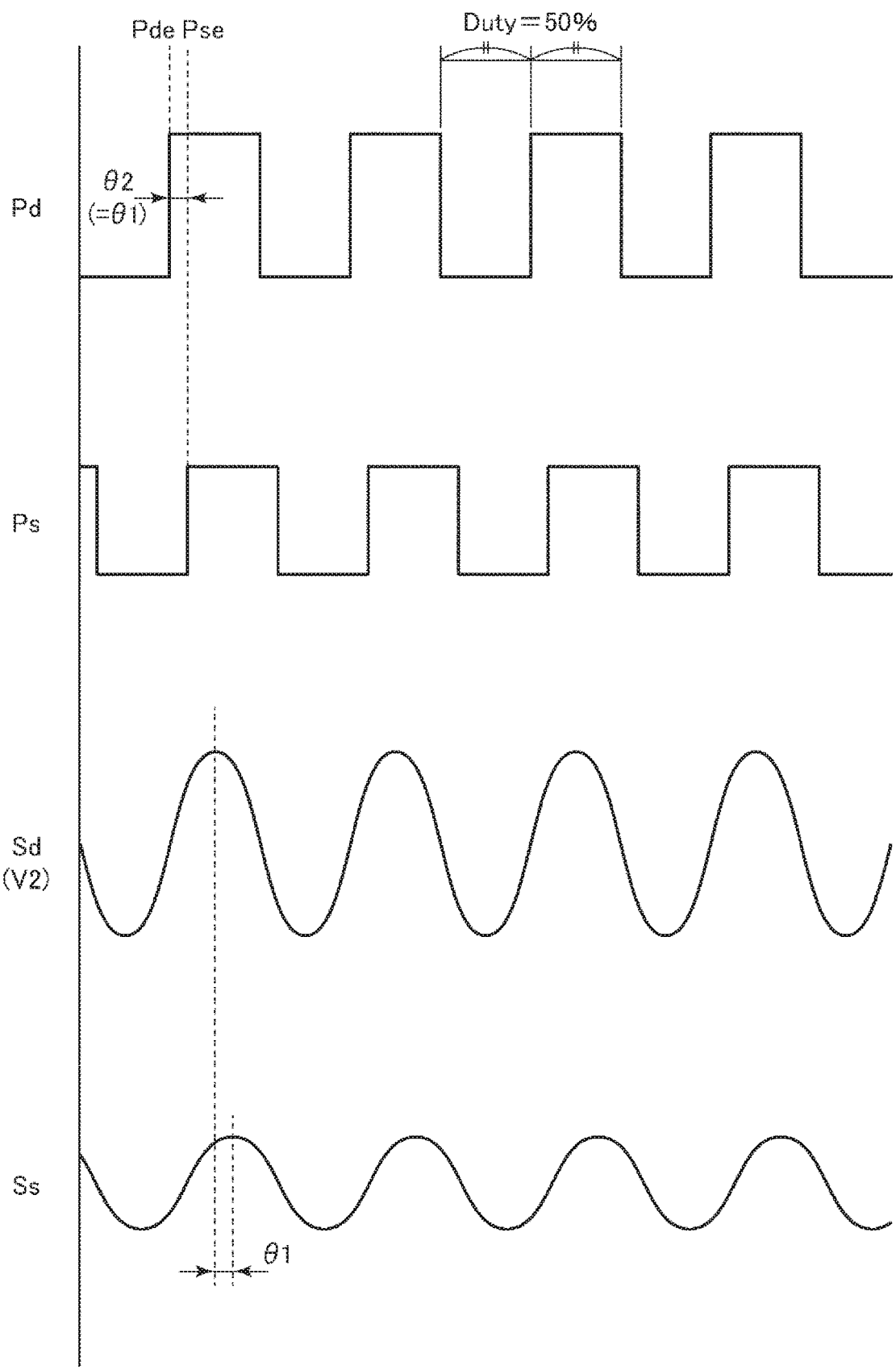
FIG. 8 is a diagram illustrating a method of acquiring a phase difference of the related art.
Figure 9:
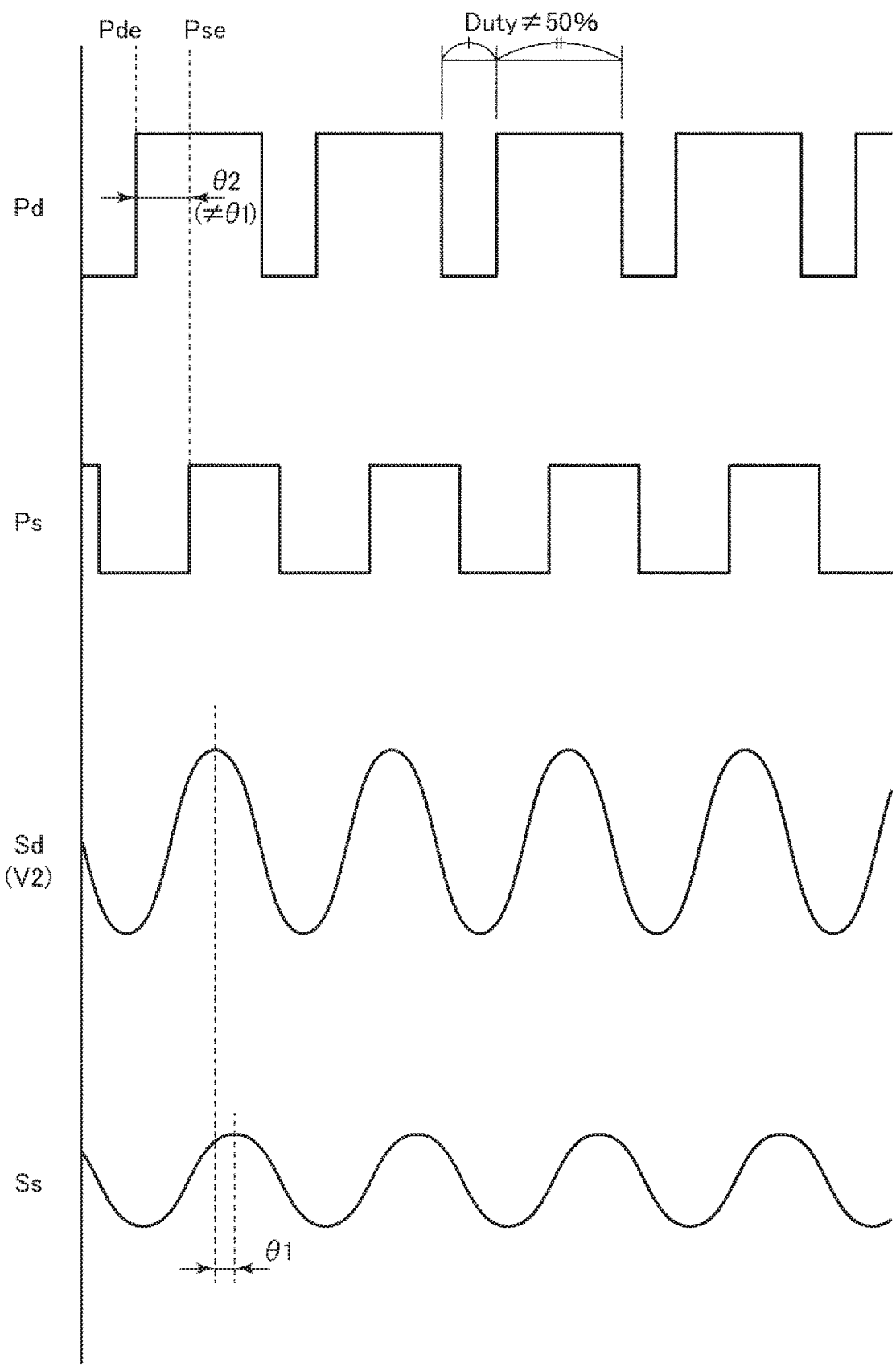
FIG. 9 is a diagram illustrating the method of acquiring the phase difference of the related art.
Figure 10:
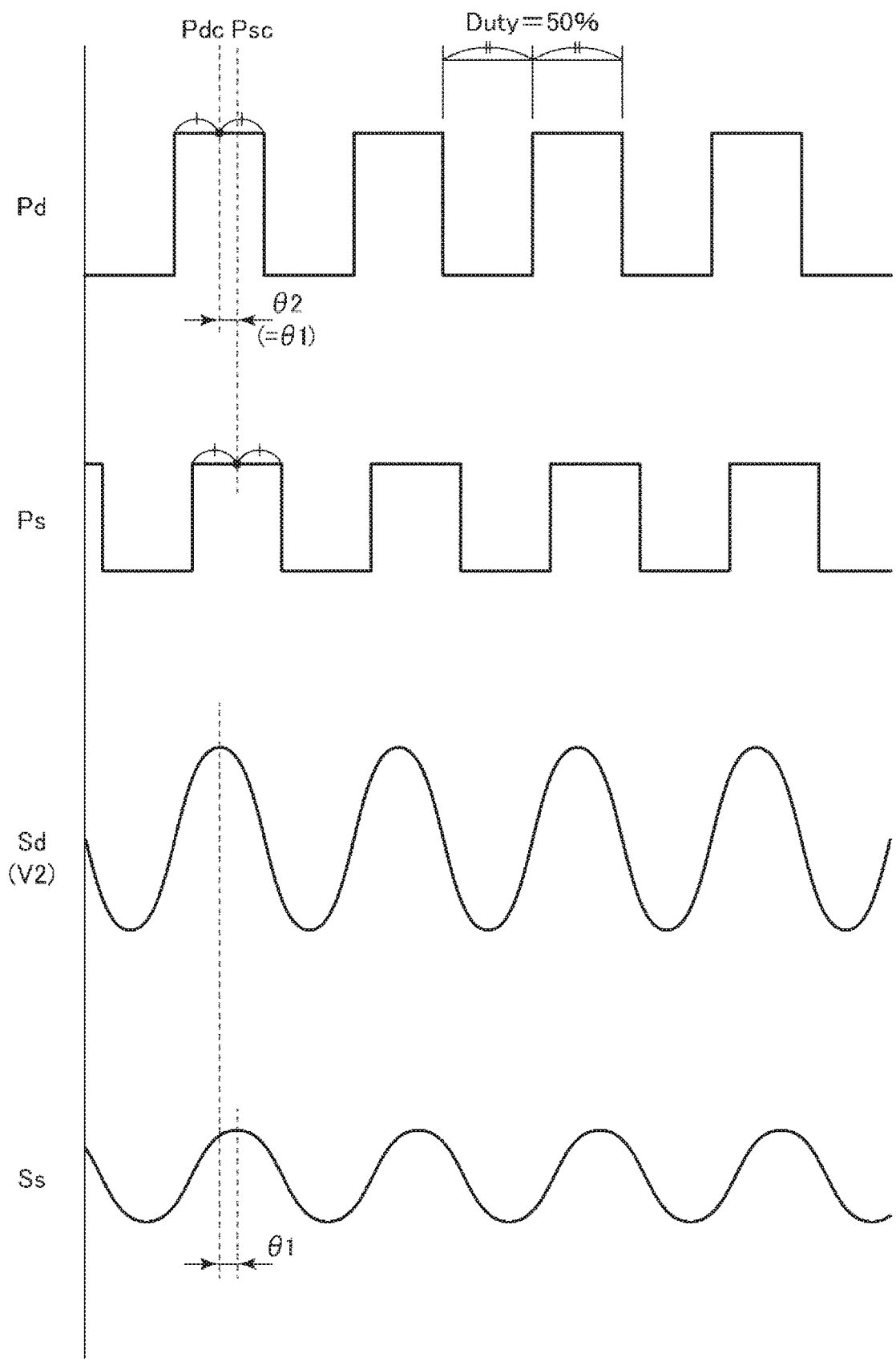
FIG. 10 is a diagram a method of acquiring a phase difference according to the first embodiment.
Figure 11:
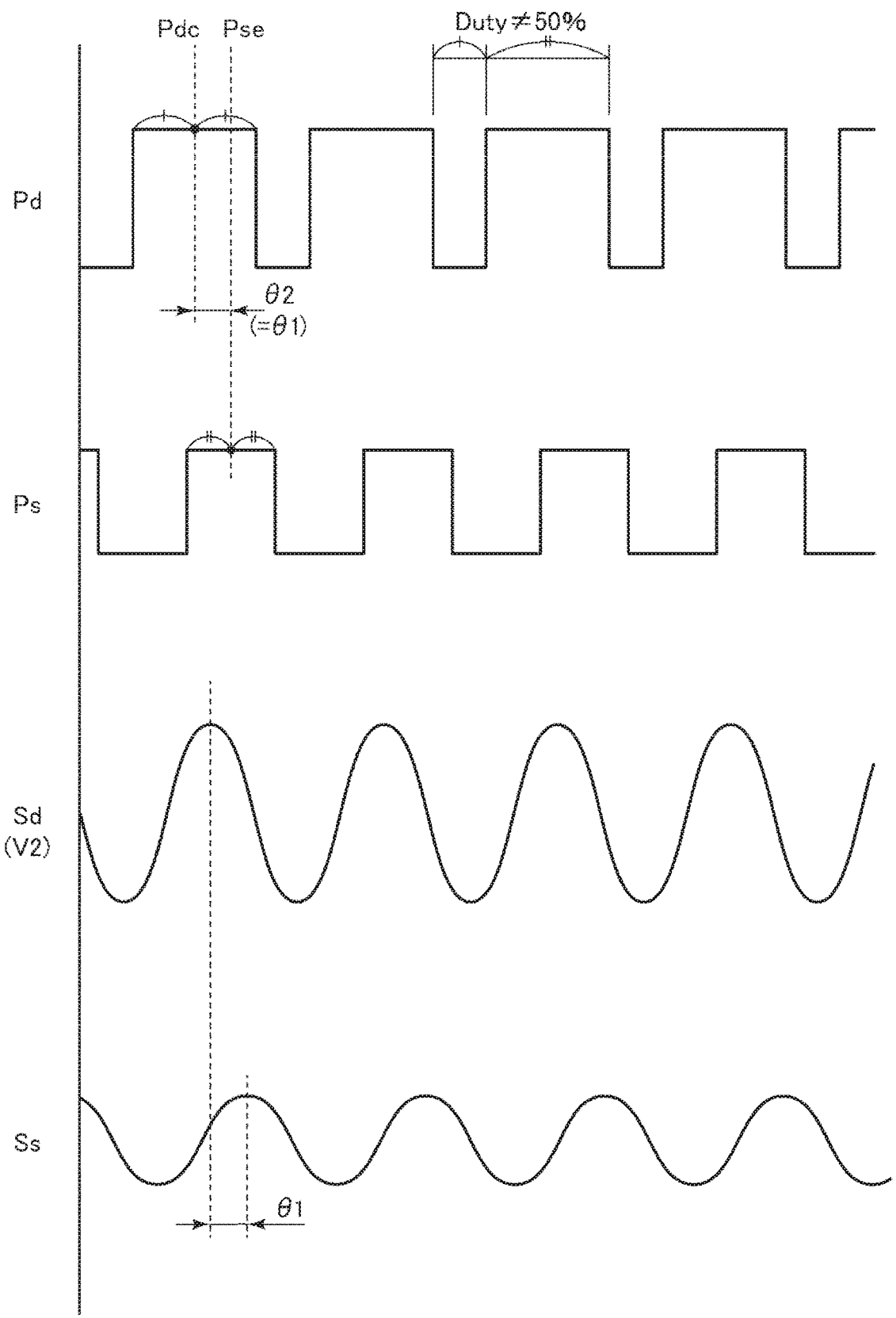
FIG. 11 is a diagram illustrated the method of acquiring the phase difference according to the first embodiment.
Figure 12:
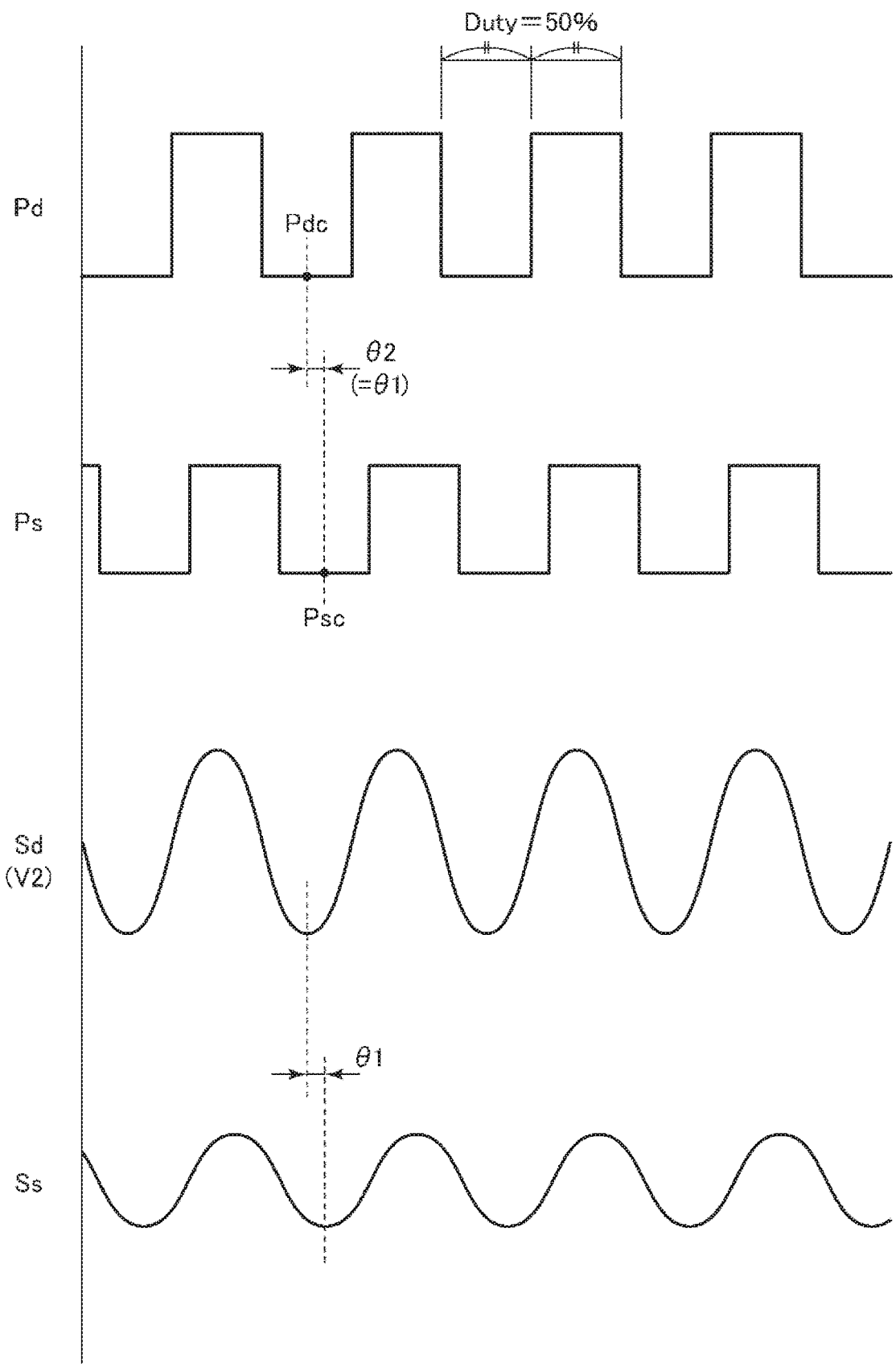
FIG. 12 is a diagram illustrating the method of acquiring the phase difference according to the first embodiment.

FIG. 1 is a perspective view illustrating an entire configuration of a piezoelectric motor according to a first embodiment of the invention. FIG. 2 is an exploded perspective view of the piezoelectric drive device illustrated in FIG. 1. FIG. 3 is a diagram illustrating a drive signal applied to the piezoelectric drive device and a detection signal output from the piezoelectric drive device. FIG. 4 is a diagram illustrating drive of the piezoelectric motor when the drive signal illustrated in FIG. 3 is applied. FIG. 5 is a diagram illustrating the drive signal applied to the piezoelectric drive device and the detection signal output from the piezoelectric drive device. FIG. 6 is a diagram illustrating drive of the piezoelectric motor when a voltage illustrated in FIG. 5 is applied. FIG. 7 is a circuit diagram illustrating a control device. FIGS. 8 and 9 are diagrams illustrating a method of acquiring a phase difference of the related art, respectively. FIGS. 10 to 12 are diagrams a method of acquiring a phase difference according to the first embodiment. Hereinafter, for the sake of convenient description, a rotor 110 side of the piezoelectric drive device 1 is also referred to as a "tip side", and a side opposite to the rotor 110 is also referred to as a "proximal side".

A piezoelectric motor 100 (ultrasonic motor) illustrated in FIG. 1 includes a rotor 110 as a driven portion (a following portion) which is rotatable around a rotation axis O, a piezoelectric drive device 1 (piezoelectric actuator) in contact with an outer peripheral surface 111 of the rotor 110, and a control device 9 that controls drive of the piezoelectric drive device 1. The piezoelectric motor 100 can rotate the rotor 110 around the rotation axis O by bending and vibrating the piezoelectric drive device 1 under the control of the control device 9.

The configuration of the piezoelectric motor 100 is not limited to the configuration illustrated in FIG. 1. For example, a plurality of piezoelectric drive devices 1 may be disposed in a peripheral direction of the rotor 110, and the rotor 110 may be rotated by driving the plurality of piezoelectric drive devices 1. According to the configuration, the piezoelectric motor 100 can rotate the rotor 110 with a larger driving force (torque) and a higher rotational speed. In addition, in the piezoelectric drive device 1, the transfer portion 14 may be in contact with a main surface (a pair of flat surfaces facing each other) of the rotor 110. In addition, the driven portion is not limited to a rotation body such as the rotor 110, and may be, for example, a moving object that linearly moves.

As illustrated in FIG. 1, the piezoelectric drive device 1 includes a vibration body 11, a support portion 12 for supporting the vibration body 11, a connection portion 13 connecting the vibration body 11 to the support portion 12, and a transfer portion 14 that is provided in the vibration body 11 and transfers vibration of the vibration body 11 to the rotor 110.

The vibration body 11 is a portion that bends and vibrates and has a rectangular shape (longitudinal shape) in a plan view from a thickness direction of the piezoelectric drive device 1. The support portion 12 supports the vibration body 11 and functions as a fixing portion for fixing the piezoelectric drive device 1 to a stage or the like. In addition, the support portion 12 has a U-shape surrounding the proximal side of the vibration body 11 in a plan view from the thickness direction of the piezoelectric drive device 1. In addition, the connection portion 13 connects a portion (a central portion in the longitudinal direction) which is a node of bending vibration of the vibration body 11 to the support portion 12. However, shapes and disposition of the vibration body 11, the support portion 12, and the connection portion 13 are not limited in particular as long as those can exhibit their functions.

The transfer portion 14 is provided on a tip side of the vibration body 11 and protrudes from the central portion in a width direction. In addition, a tip portion of the transfer portion 14 is in contact with the rotor 110. Accordingly, the vibration of the vibration body 11 is transferred to the rotor 110 via the transfer portion 14, and thereby, the rotor 110 rotates. A configuration material of the transfer portion 14 is not limited in particular, but it is preferable to be a hard material. Such a material includes various ceramics such as zirconia, alumina, titania, and the like. Thereby, the transfer portion 14 can have a high durability, the transfer portion 14 can be prevented from deforming, and the vibration of the vibration body 11 can be efficiently transferred to the rotor 110.

Here, the vibration body 11, the support portion 12, and the connection portion 13 are configured with a first substrate 3 and a second substrate 4 that are disposed to face each other, and a piezoelectric element 5 and a spacer 6 located between the first substrate 3 and the second substrate 4.

As illustrated in FIG. 2, the first substrate 3 includes a vibration portion 31, a support portion 32 that supports the vibration portion 31, and a connection portion 33 that connects the vibration portion 31 to the support portion 32. In the same manner, the second substrate 4 includes a vibration portion 41, a support portion 42 that supports the vibration portion 41, and a connection portion 43 that connects the vibration portion 41 to the support portion 42. The first substrate 3 and the second substrate 4 have the same shape and size, the vibration portions 31 and 41 are opposed to each other with the piezoelectric element 5 interposed therebetween, and the support portions and 42 are opposed to each other with the spacer 6 interposed therebetween. The vibration body 11 is configured with a stacking body of the vibration portion 31, the piezoelectric element 5, and the vibration portion 41. The support portion 12 is configured with a stacking body of the support portion 32, the spacer 6, and the support portion 42. The connection portion 13 is configured with the connection portions 33 and 43.

The first substrate 3 and the second substrate 4 are not limited in particular, and for example, a silicon substrate can be used therefor. Thereby, the first substrate 3 and the second substrate 4 can be formed with a high dimensional accuracy by, for example, etching or the like.

The piezoelectric element 5 is located between the vibration portions 31 and 41 and is bonded to each of the vibration portions 31 and 41 via an adhesive (not illustrated). In addition, the piezoelectric element 5 includes five piezoelectric elements 5A, 5B, 5C, 5D, and 5E for drive and a piezoelectric element 5F for detection. The piezoelectric element 5C is at the central portion of the vibration body 11 in the width direction and is disposed in a longitudinal direction of the vibration body 11. The piezoelectric elements 5A and 5B are arranged side by side in the longitudinal direction of the vibration body 11 on one side of the vibration body 11 in the width direction, and the piezoelectric elements 5D and 5E are arranged side by side in the longitudinal direction of the vibration body on the other side, with respect to the piezoelectric element 5C. In addition, the piezoelectric element 5F is disposed on a tip side of the piezoelectric element 5C.

The piezoelectric elements 5A, 5B, 5C, 5D, 5E, and 5F and a pair of electrodes 52 and 53 are configured to interpose the piezoelectric body 51 therebetween. Each of the piezoelectric elements 5A, 5B, 5C, 5D, and 5E for drive expands and contracts in the longitudinal direction of the vibration body 11 by applying a voltage to the electrodes and 53. Meanwhile, the piezoelectric element 5F for detection generates electric charges in accordance with the deformation of the vibration body 11.

In the present embodiment, the piezoelectric body 51 is shared by the piezoelectric elements 5A, 5B, 5C, 5D, 5E, and 5F. The electrode 52 is also shared by the piezoelectric elements 5A, 5B, 5C, 5D, 5E, and 5F, and is connected to, for example, GND (ground). Meanwhile, the electrodes 53 is separately formed from the piezoelectric elements 5A, 5B, 5C, 5D, 5E, and 5F, and separate drive signals are applied thereto. However, a configuration of the piezoelectric element 5 is not limited to this, and for example, both or one of the piezoelectric body 51 and the electrode 52 may be separately (as a separate body) formed from the piezoelectric elements 5A, 5B, 5C, 5D, 5E, and 5F. In addition, the number and arrangement of the piezoelectric elements for drive are not limited in particular as long as the vibration body 11 can have a desirable vibration, and for example, the piezoelectric element 5C may be omitted. In addition, the number and arrangement of the piezoelectric elements for detection are not limited in particular as long as electric charges can be taken out according to the vibration of the vibration body 11.

Piezoelectric ceramics such as, lead zirconate titanate (PZT), barium titanate, lead titanate, potassium niobate, lithium niobate, lithium tantalate, sodium tungstate, zinc oxide, barium strontium titanate (BST), strontium bismuth tantalate (SBT), lead metaniobate, and scandium lead niobate can be used as a configuration material of the piezoelectric body 51. A piezoelectric body configured by the piezoelectric ceramics may be formed from, for example, a bulk material, or may be formed by a sol-gel method or a sputtering method, but it is preferable to be formed from the bulk material. Thereby, the piezoelectric element 5 is easily manufactured. In addition to the above-described piezoelectric ceramics, polyvinylidene fluoride, quartz, or the like may be used as the configuration material of the piezoelectric body 51.

The spacer 6 is located between the support portions 32 and 42 and is bonded to each of the support portions 32 and 42 via an insulating adhesive (not illustrated). A thickness of the spacer 6 is substantially equal to the thickness of the piezoelectric element 5, and bending of the first substrate 3 and the second substrate 4 is suppressed.

The spacer 6 is not limited in particular, and, for example, various ceramics such as zirconia, alumina, titania, various metallic materials, silicon, various resin materials, and the like can be used therefor. It is preferable to use various ceramics, various metallic materials, and silicon among those, and thereby, a hard spacer 6 is obtained. However, in a case where a metallic material is used, for example, processing such as performing insulation processing on a surface thereof is required to impart insulation property to the spacer 6.

For example, if a drive signal V1 in FIG. 3 is applied to the piezoelectric elements 5A and 5E, a drive signal V2 in FIG. 3 is applied to the piezoelectric element 5C, and a drive signal V3 in FIG. 3 is applied to the piezoelectric elements 5B and 5D, the vibration body 11 bends and vibrates in an S shape as illustrated in FIG. 4, and thereby, the transfer portion 14 elliptically moves counterclockwise in the figure. By such an elliptical motion of the transfer portion 14, the rotor 110 is driven out and the rotor 110 rotates clockwise. The drive signals V1, V2, and V3 have the same waveform (same frequency and same amplitude) and have only different phases.

In addition, for example, if a drive signal V1' in FIG. 5 is applied to the piezoelectric elements 5A and 5E, a drive signal V2' in FIG. 5 is applied to the piezoelectric element 5C, and a drive signal V3' in FIG. 5 is applied to the piezoelectric elements 5B and 5D, the vibration body 11 bends and vibrates in an S shape as illustrated in FIG. 6, and thereby, the transfer portion 14 elliptically moves in a clockwise direction in the figure. By such an elliptical motion of the transfer portion 14, the rotor 110 is driven out, and the rotor 110 rotates counterclockwise. The drive signals V1', V2', and V3' have the same waveform (same frequency and same amplitude) and have only different phases.

A pattern of the drive signal Sd which is applied to the piezoelectric drive device 1 is not limited in particular as long as the transfer portion 14 can elliptically move in the clockwise direction or the counterclockwise direction. Hereinafter, the drive signals V1, V2, and V3 (drive signals V1', V2', and V3') are collectively referred to as the "drive signal Sd" for the sake of convenient description.

If the vibration body 11 vibrates as described above, the piezoelectric element 5F is deflected, and electric charges generated from the piezoelectric body 51 is output from the piezoelectric element 5F (between the electrodes 52 and 53) as a detection signal Ss by the deflection (refer to FIG. 3 and FIG. 5). The detection signal Ss has substantially the same frequency as the drive signal Sd, and there is a phase difference between the detection signal and the drive signal Sd. The control device 9 uses the detection signal Ss to control (feedback control) the drive of the piezoelectric drive device 1.

Next, the control device 9 will be described. As illustrated in FIG. 7, the control device 9 includes a drive pulse signal generation unit 91 that generates a drive pulse signal Pd, a drive signal generation unit 92 that generates the drive signal Sd which is applied to the piezoelectric elements 5A, 5B, 5C, 5D, and 5E from the drive pulse signal Pd, a detection pulse signal generation unit 93 that generates a detection pulse signal Ps by binarizing the detection signal Ss output from the piezoelectric element 5F, a phase difference acquisition unit 94 that acquires a phase difference $\theta 2$ between the drive pulse signal Pd and the detection pulse signal Ps, and a drive control unit 95 that controls drive of the drive pulse signal generation unit 91 based on the phase difference $\theta 2$.

The drive pulse signal generation unit 91 generates the drive pulse signal Pd (digital signal) for generating the drive signal Sd. As illustrated in FIG. 7, the drive pulse signal Pd generated by the drive pulse signal generation unit 91 has a rectangular wave (square wave) binarized to High and Low. The drive pulse signal generation unit 91 can change a duty of the drive pulse signal Pd. By changing the duty of the drive pulse signal Pd, an amplitude of the drive signal Sd can be changed, and if the duty is set to 50% (High:Low is 1:1), the amplitude of the drive signal Sd is maximized, and as the duty approaches 0%, the amplitude of the drive signal Sd decreases.

A configuration of the drive pulse signal generation unit 91 is not limited in particular as long as the drive pulse signal Pd can be generated and the duty of the drive pulse signal Pd can be changed. As illustrated in FIG. 7, the drive pulse signal generation unit 91 according to the present embodiment includes a first electrode 91A that is a potential of GND, a second electrode 91B that is a potential of +VDD, and a switching element 91C, and is configured to generate the drive pulse signal Pd by alternately switching between a state in which the first electrode 91A is connected to the switching element 91C and a state in which the second electrode 91B is connected to the switching element 91C. In addition, in the present embodiment, the drive pulse signal generation unit 91 includes a first drive pulse signal generation unit 911, a second drive pulse signal generation unit 912, and a third drive pulse signal generation unit 913 so as to generate three different drive signals (drive signals V1, V2, and V3 and drive signals V1', V2', and V3').

A drive signal generation unit 92 generates the drive signal Sd (analog signal) from the drive pulse signal Pd generated by the drive pulse signal generation unit 91. As illustrated in FIG. 7, the drive signal Sd generated by the drive signal generation unit 92 is a substantially sinusoidal signal.

A configuration of the drive signal generation unit 92 is not limited in particular as long as the above-described drive signal Sd can be generated. As illustrated in FIG. 7, the drive signal generation unit 92 according to the present embodiment mainly includes a buffer 92A and a coil 92B. In addition, in the present embodiment, the drive signal generation unit 92 includes a first drive signal generation unit 921 connected to the first drive pulse signal generation unit 911, a second drive signal generation unit 922 connected to the second drive pulse signal generation unit 912, and a third drive signal generation unit 923 connected to the third drive pulse signal generation unit 913 so as to generate three different drive signals (drive signals V1, V2, and V3 and drive signals V1', V2', and V3').

By applying the three drive signals (for example, the drive signals V1, V2, and V3 and the drive signals V1', V2', and V3') generated by the drive signal generation unit 92 to the piezoelectric elements 5A, 5B, 5C, 5D, and 5E, the vibration body 11 bends and vibrates, and thereby, the rotor 110 rotates as described above.

The detection pulse signal generation unit 93 binarizes the detection signal Ss (analog signal) output from the piezoelectric element 5F according to the bending vibration of the vibration body 11 to generate the detection pulse signal Ps (digital signal). As illustrated in FIG. 7, the detection signal Ss output from the piezoelectric element 5F is a substantially sinusoidal signal corresponding to the amplitude of the vibration body 11, and the detection pulse signal Ps is a rectangular wave (square wave) signal obtained by binarizing the detection signal Ss to High and Low. A configuration of the detection pulse signal generation unit 93 is not limited in particular as long as the above-described detection pulse signal Ps can be generated. As illustrated in FIG. 7, the detection pulse signal generation unit 93 according to the present embodiment has a configuration including a comparator 93A.

The phase difference acquisition unit 94 acquires the phase difference $\theta 2$ between the drive pulse signal Pd and the detection pulse signal Ps. As such, by acquiring the phase difference $\theta 2$, a vibration state of the vibration body 11 can be monitored. Since a method of acquiring the phase difference $\theta 2$ using the phase difference acquisition unit 94 is particularly characteristic in the control device 9, the method of acquiring the phase difference $\theta 2$ will be described hereinafter in detail.

As described above, the drive pulse signal generation unit 91 includes a first drive pulse signal generation unit 911, a second drive pulse signal generation unit 912, and a third drive pulse signal generation unit 913 from which drive pulse signals Pd are respectively generated. Accordingly, a phase difference between the drive pulse signal Pd generated by the first drive pulse signal generation unit 911 and the detection pulse signal Ps may be acquired as the phase difference $\theta 2$, a phase difference between the drive pulse signal Pd generated by the second drive pulse signal generation unit 912 and the detection pulse signal Ps may be acquired as the phase difference $\theta 2$, or a phase difference between the drive pulse signal Pd generated by the third drive pulse signal generation unit 913 and the detection pulse signal Ps may be acquired as the phase difference $\theta 2$. Hereinafter, for the sake of convenient description, a case where the phase difference between the drive pulse signal Pd generated by the second drive pulse signal generation unit 912 and the detection pulse signal Ps is acquired as the phase difference $\theta 2$ will be described.

As illustrated in FIG. 8, in a case where a phase difference $\theta 1$ between the drive signal V2 and the detection signal Ss is acquired as the phase difference $\theta 2$ between a rising edge Pde (edge) of the drive pulse signal Pd and a rising edge Pse (edge) of the detection pulse signal Ps as in the related art, when a duty of the drive pulse signal Pd is 50%, the phase difference $\theta 2$ can coincide with the phase difference $\theta 1$, and the phase difference $\theta 1$ can be acquired with high accuracy. However, as illustrated in FIG. 9, as the duty of the drive pulse signal Pd deviates from 50%, the phase difference θ2 deviates from the phase difference θ1, and the phase difference θ1 cannot be acquired with high accuracy. As such, according to the method in the related art, the phase difference θ2 is affected by the duty of the drive pulse signal Pd, and the vibration state of the vibration body 11 cannot be detected with high accuracy.

In contrast to this, the phase difference acquisition unit 94 according to the present embodiment acquires the phase difference θ2, based on a rising edge and a falling edge of the drive pulse signal Pd and a rising edge and a falling edge of the detection pulse signal Ps. According to this method, not only when the duty of the drive pulse signal Pd is 50% but also when the duty is shifted from 50%, the phase difference θ2 substantially coincides with the phase difference θ1. That is, in the present embodiment, the phase difference θ2 is not affected by the duty of the drive pulse signal Pd, and the vibration state of the vibration body 11 can be detected with high accuracy regardless of the duty of the drive pulse signal Pd.

Specifically, as illustrated in FIGS. 10 and 11, the phase difference acquisition unit 94 acquires the phase difference θ2, based on the center Pdc of the rising and falling edges of the drive pulse signal Pd and the center Psc of the rising and falling edges of the detection pulse signal Ps. Thereby, it is possible to more reliably acquire the phase difference θ2 that coincides with the phase difference θ1 regardless of the duty of the drive pulse signal Pd. This is apparent from FIG. 10 illustrating the phase difference θ2 when the drive pulse signal Pd has duty=50% and FIG. 11 illustrating the phase difference θ2 when the drive pulse signal Pd has the duty≠50%. The center Pdc is meant to include not only a case where the center coincides with the center of the rising and falling edges of the drive pulse signal Pd but also a case where the center is slightly shifted from the center of the rising and falling edges of the drive pulse signal (for example, a case where technically unavoidable shifting is made). Likewise, the center Psc is meant to include not only a case where the center coincides with the center of the rising and falling edges of the detection pulse signal Ps, but also a case where the center is slightly shifted from the center of the rising and falling edges of the detection pulse signal (for example, a case where technically unavoidable shifting is made).

Here, in the present embodiment, the center of a High state of the drive pulse signal Pd is set as the center Pdc, the center of a High state of the detection pulse signal Ps is set as the center Psc, and the phase difference therebetween is set as the phase difference θ2, but the present embodiment is not limited thereto, and the center of a Low state of the drive pulse signal Pd may be set as the center Pdc, the center of a Low state of the detection pulse signal Ps may be set as the center Psc, and the phase difference therebetween may be set as the phase difference θ2, as illustrated in FIG. 12. According to the method, the same effect as in the present embodiment can also be obtained.

The drive control unit 95 controls drive of the drive pulse signal generation unit 91, based on the phase difference θ2 acquired by the phase difference acquisition unit 94. For example, the drive control unit 95 changes a frequency of each drive pulse signal Pd as needed such that the phase difference θ2 tracks a predetermined value. Since there is a correlation between an amplitude of the vibration body 11 and the phase difference θ2 (θ1), the phase difference θ2 is adjusted to a value at which the amplitude of the vibration body 11 becomes a maximum value, and thereby, the rotor 110 can rotate at a higher speed.

The control device 9 of the piezoelectric drive device 1 is described above. As described above, the control device 9 is a control device of the piezoelectric drive device 1 including the vibration body 11 that includes the piezoelectric elements 5A, 5B, 5C, 5D, and 5E (piezoelectric elements for drive) and the piezoelectric element 5F (piezoelectric element for detection), vibrates according to the drive of the piezoelectric elements 5A, 5B, 5C, 5D, and 5E, and outputs the detection signal Ss according to the vibration from the piezoelectric element 5F. The control device 9 includes the drive pulse signal generation unit 91 that generates a binary drive pulse signal Pd, the drive signal generation unit 92 that generates the drive signal Sd which is applied to the piezoelectric elements 5A, 5B, 5C, 5D, and 5E from the drive pulse signal Pd, the detection pulse signal generation unit 93 that binarizes the detection signal Ss output from the piezoelectric element 5F to generate the detection pulse signal Ps, and the phase difference acquisition unit 94 that acquires the phase difference θ2 between the drive pulse signal Pd and the detection pulse signal Ps, based on the rising and falling edges of the drive pulse signal Pd and the rising and falling edges of the detection pulse signal Ps. According to the configuration, the phase difference θ2 is not affected by the duty of the drive pulse signal Pd, and thus, it is possible to detect a vibration state of the vibration body 11 with high accuracy, regardless of the duty of the drive pulse signal Pd. Accordingly, it is possible to control drive of the piezoelectric drive device 1 with high accuracy.

As described above, the phase difference acquisition unit 94 acquires the phase difference θ2, based on the center Pdc of the rising and falling edges of the drive pulse signal Pd and the center Psc of the rising and falling edges of the detection pulse signal Ps. Thereby, it is possible to detect a vibration state of the vibration body 11 with high accuracy regardless of the duty of the drive pulse signal Pd.

In addition, as described above, the control device 9 includes the drive control unit 95 that controls drive of the drive pulse signal generation unit 91, based on the phase difference θ2 acquired by the phase difference acquisition unit 94. Thereby, it is possible to adjust the phase difference θ2 to a predetermined value, and to efficiently vibrate the vibration body 11.

In addition, as described above, the control method of the piezoelectric drive device 1 is a control method of the piezoelectric drive device 1 including the vibration body 11 that includes the piezoelectric elements 5A, 5B, 5C, 5D, and 5E (piezoelectric elements for drive) and the piezoelectric element 5F (piezoelectric element for detection), vibrates according to the drive of the piezoelectric elements 5A, 5B, 5C, 5D, and 5E, and outputs the detection signal Ss according to the vibration from the piezoelectric element 5F. In the control method, the binary drive pulse signal Pd is generated, the drive signal Sd which is applied to the piezoelectric elements 5A, 5B, 5C, 5D, and 5E is generated from the drive pulse signal Pd, the detection signal Ss output from the piezoelectric element 5F is binarized to generate the detection pulse signal Ps, and the phase difference θ2 between the drive pulse signal Pd and the detection pulse signal Ps is acquired based on the rising and falling edges of the drive pulse signal Pd and the rising and falling edges of the detection pulse signal Ps. According to the control method, the phase difference θ2 is not affected by the duty of the drive pulse signal Pd, and thus, it is possible to detect a vibration state of the vibration body 11 with high accuracy, regardless of the duty of the drive pulse signal Pd. Therefore, it is possible to precisely control the drive of the piezoelectric drive device 1.

In addition, as described above, in the control method of the piezoelectric drive device 1, the phase difference θ2 is acquired based on the center Pdc of the rising and falling edges of the drive pulse signal Pd and the center Psc of the rising and falling edges of the detection pulse signal Ps. Thereby, it is possible to detect a vibration state of the vibration body 11 with high accuracy, regardless of the duty of the drive pulse signal Pd.

In addition, as described above, in the control method of the piezoelectric drive device 1, the drive pulse signal Pd is generated based on the phase difference θ2. Thereby, it is possible to adjust the phase difference θ2 to a predetermined value, and to efficiently vibrate the vibration body 11.

Second Embodiment

Next, a control device of a piezoelectric drive device and a control method of the piezoelectric drive device according to a second embodiment of the invention will be described.

Figure 13:
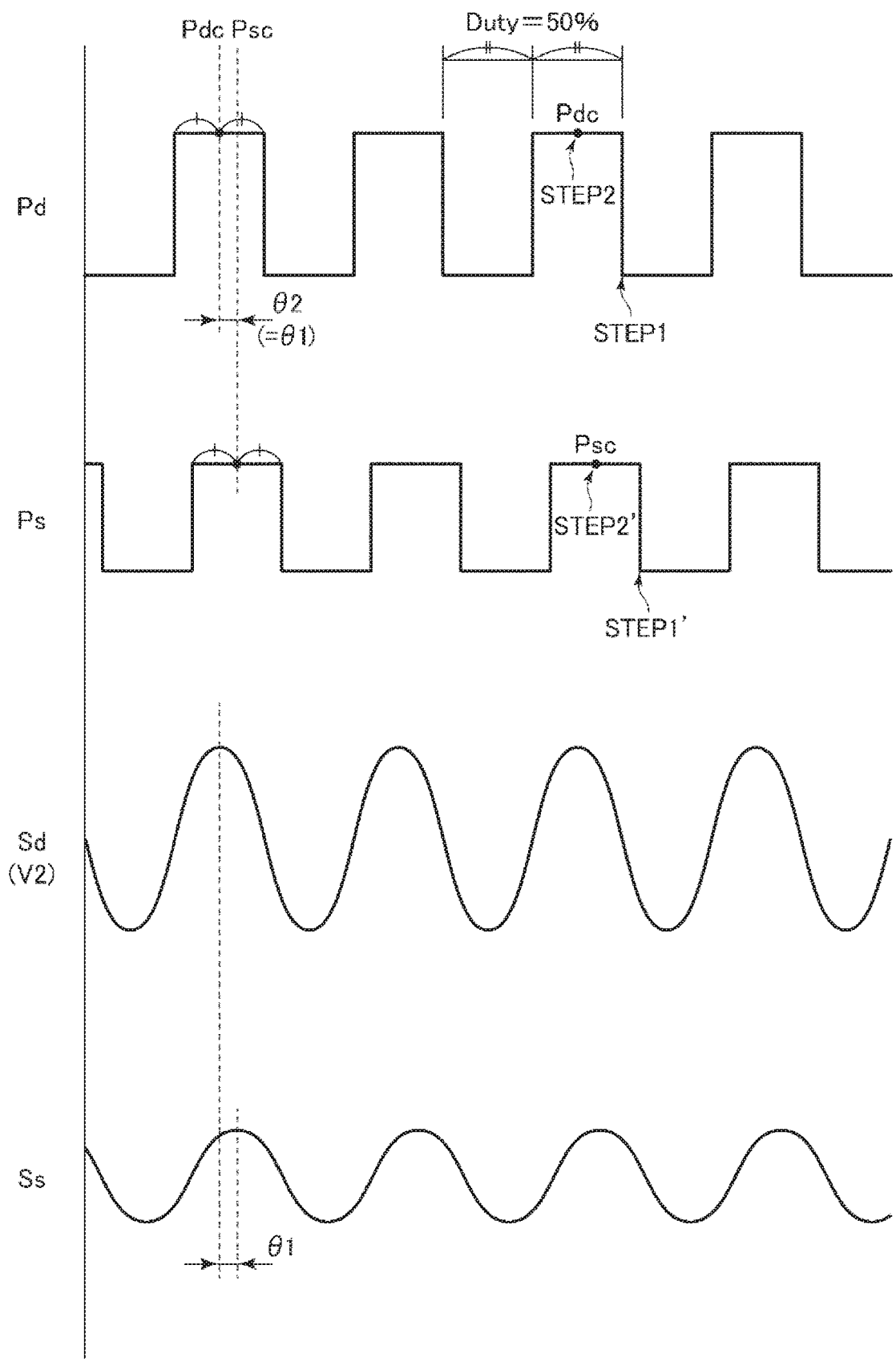
FIG. 13 is a diagram illustrating a method of acquiring a phase difference according to a second embodiment.

FIG. 13 is a diagram illustrating a method of acquiring a phase difference according to the second embodiment.

A control device 9 (control method) of a piezoelectric drive device 1 according to the present embodiment is the same as the control device 9 according to the first embodiment, except that a configuration of a phase difference acquisition unit 94 (a method of acquiring the phase difference θ2) is mainly different.

In the following description, the control device 9 according to the second embodiment will be described by focusing on different points from the control device according to the first embodiment, and description on the same matters will be omitted. In addition, in FIG. 13, the same reference numerals or symbols are given to the same configuration as the configuration according to the first embodiment described above.

The phase difference acquisition unit 94 according to the present embodiment acquires the phase difference θ2 between the drive pulse signal Pd and the detection pulse signal Ps, based on the duty of the drive pulse signal Pd, a rising edge or a falling edge of the drive pulse signal Pd, and a rising edge or a falling edge of the detection pulse signal Ps. According to such a method, not only when the duty of the drive pulse signal Pd is 50% but also when the duty is shifted from 50%, the phase difference θ2 substantially coincides with the phase difference θ1. That is, in the present embodiment, the phase difference θ2 is not affected by the duty of the drive pulse signal Pd, and it is possible to detect a vibration state of the vibration body 11 with high accuracy regardless of the duty of the drive pulse signal Pd.

The phase difference acquisition unit 94 predicts the center Pdc of the rising and falling edges of the drive pulse signal Pd, based on the duty of the drive pulse signal Pd and the rising edge or the falling edge of the drive pulse signal Pd, and predicts the center Psc of the rising and falling edges of the detection pulse signal Ps, based on the rising edge or the falling edge of the detection pulse signal Ps, and acquires the phase difference θ2, based on the predicted centers Pdc and Psc.

Specifically, the phase difference acquisition unit 94 acquires a frequency of the drive pulse signal Pd and the duty of the drive pulse signal Pd from the drive control unit 95, and thereby, if the rising edge of the drive pulse signal Pd is known, the falling edge can be predicted (STEP1), and if the falling edge can be predicted, the center Pdc can be predicted (STEP2), as illustrated in FIG. 13. Meanwhile, since the detection pulse signal Ps has a duty of 50% and has the same frequency as the drive pulse signal Pd, if the rising edge of the detection pulse signal Ps is known, the falling edge can be predicted (STEP1'), and if the falling edge can be predicted, the center Psc can be predicted (STEP2'). The phase difference acquisition unit 94 acquires the phase difference θ2, based on the centers Pdc and Psc predicted as described above. According to such a method, it is possible to acquire the phase difference θ2 in real time and to detect a vibration state of the vibration body 11 with high accuracy.

In the first embodiment described above, the center Pdc is unknown until the drive pulse signal Pd is changed from the rising edge to the falling edge (or from the falling edge to the rising edge), and likewise, the center Psc is unknown until the detection pulse signal Ps is changed from the rising edge to the falling edge (or the falling edge to the rising edge). Accordingly, it is impossible to acquire the phase difference θ2 in real time. In contrast to this, according to the present embodiment, if the drive pulse signal Pd and the detection pulse signal Ps rise, the centers Pdc and Psc can be predicted, and thereby, the phase difference θ2 can be acquired in real time. Accordingly, it is possible to detect a vibration state of the vibration body 11 with high accuracy.

As described above, the phase difference acquisition unit 94 predicts the center Pdc based on the rising edge of the drive pulse signal Pd, predicts the center Psc based on the rising edge of the detection pulse signal Ps, and acquires the phase difference θ2 based on the predicted centers Pdc and Psc. However, the invention is not limited to this, and the center Pdc may be predicted based on the falling edge of the drive pulse signal Pd, the center Psc may be predicted based on the falling edge of the detection pulse signal Ps, and the phase difference θ2 may be acquired based on the predicted centers Pdc and Psc. According to the method, the same effect as in the present embodiment is also obtained.

As such, the control device 9 of the piezoelectric drive device 1 according to the present embodiment is described above. As described above, the control device 9 is a control device of the piezoelectric drive device 1 including the vibration body 11 that includes the piezoelectric elements 5A, 5B, 5C, 5D, and 5E (piezoelectric elements for drive) and the piezoelectric element 5F (piezoelectric element for detection), vibrates according to the drive of the piezoelectric elements 5A, 5B, 5C, 5D, and 5E, and outputs the detection signal Ss according to the vibration from the piezoelectric element 5F. The control device 9 includes the drive pulse signal generation unit 91 that generates a binary drive pulse signal Pd, the drive signal generation unit 92 that generates the drive signal Sd which is applied to the piezoelectric elements 5A, 5B, 5C, 5D, and 5E from the drive pulse signal Pd, the detection pulse signal generation unit 93 that binarizes the detection signal Ss output from the piezoelectric element 5F to generate the detection pulse signal Ps, and the phase difference acquisition unit 94 that acquires the phase difference θ2 between the drive pulse signal Pd and the detection pulse signal Ps, based on the duty of the drive pulse signal Pd, the rising edge or the falling edge of the drive pulse signal Pd, and the rising edge or the falling edge of the detection pulse signal Ps. According to the configuration, the phase difference θ2 is not affected by the duty of the drive pulse signal Pd, and thus, it is possible to detect a vibration state of the vibration body 11 with high accuracy, regardless of the duty of the drive pulse signal Pd. Accordingly, it is possible to control drive of the piezoelectric drive device 1 with high accuracy.

In addition, as described above, the phase difference acquisition unit 94 acquires the phase difference θ2, based on the center Pdc of the rising and falling edges of the drive pulse signal Pd predicted based on the duty of the drive pulse signal Pd and the rising edge or the falling edge of the drive pulse signal Pd, and the center Psc of the rising and falling edges of the detection pulse signal Ps predicted based on the rising edge or the falling edge of the detection pulse signal Ps. Thereby, the phase difference θ2 can be acquired in real time, and thus, it is possible to detect a vibration state of the vibration body 11 with high accuracy.

In addition, as described above, the control method of the piezoelectric drive device 1 is a control method of the piezoelectric drive device 1 including the vibration body 11 that includes the piezoelectric elements 5A, 5B, 5C, 5D, and 5E (piezoelectric elements for drive) and the piezoelectric element 5F (piezoelectric element for detection), vibrates according to the drive of the piezoelectric elements 5A, 5B, 5C, 5D, and 5E, and outputs the detection signal Ss according to the vibration from the piezoelectric element 5F. In the control method, the binary drive pulse signal Pd is generated, the drive signal Sd which is applied to the piezoelectric elements 5A, 5B, 5C, 5D, and 5E is generated from the drive pulse signal Pd, the detection signal Ss output from the piezoelectric element 5F is binarized to generate the detection pulse signal Ps, and the phase difference θ2 between the drive pulse signal Pd and the detection pulse signal Ps is acquired based on the duty of the drive pulse signal Pd, the rising edge or the falling edge of the drive pulse signal Pd, and the rising edge or the falling edge of the detection pulse signal Ps. According to such a configuration, the phase difference θ2 is not affected by the duty of the drive pulse signal Pd, and thus, it is possible to detect a vibration state of the vibration body 11 with high accuracy, regardless of the duty of the drive pulse signal Pd. Accordingly, it is possible to control drive of the piezoelectric drive device 1 with high accuracy.

In addition, as described above, in the control method, the phase difference θ2 is acquired based on the center Pdc of the rising and falling edges of the drive pulse signal Pd predicted based on the duty of the drive pulse signal Pd and the rising edge or the falling edge of the drive pulse signal Pd, and the center Psc of the rising and falling edges of the detection pulse signal Ps predicted based on the rising edge or the falling edge of the detection pulse signal Ps. Thereby, the phase difference θ2 can be acquired in real time, and thus, it is possible to detect a vibration state of the vibration body 11 with high accuracy.

According to the second embodiment described above, the same effect as in the above-described first embodiment can also be obtained.

Third Embodiment

Next, a control device of a piezoelectric drive device and a control method of the piezoelectric drive device according to a third embodiment of the invention will be described.

Figure 14:
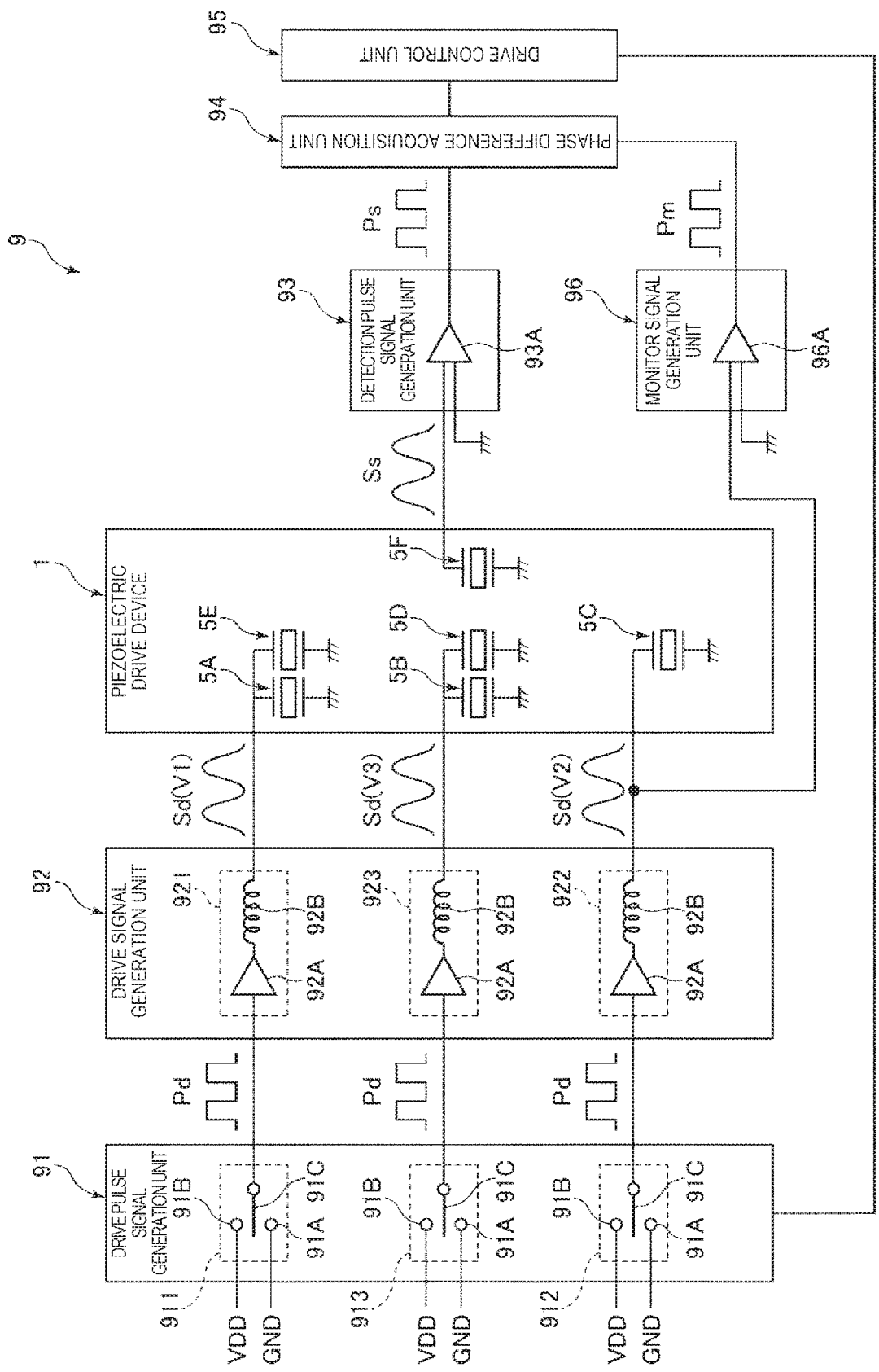
FIG. 14 is a circuit diagram illustrating a control device according to a third embodiment of the invention.

FIG. 14 is a circuit diagram illustrating the control device according to the third embodiment of the invention.

A control device 9 of a piezoelectric drive device 1 according to the present embodiment is the same as the control device 9 according to the above-described first embodiment except that a configuration of a phase difference acquisition unit 94 (a method of acquiring the phase difference θ2) is mainly different.

In the following description, the control device 9 of the piezoelectric drive device 1 according to the third embodiment will be described by focusing on different points from the control device according to the first embodiment, and description on the same matters will be omitted. In addition, in FIG. 14, the same reference numerals or symbols are given to the same configuration as the configuration according to the first embodiment described above.

As illustrated in FIG. 14, the control device 9 according to the present embodiment includes a monitor signal generation unit 96 that is a circuit which generates a monitor pulse signal Pm from a drive signal Sd generated by a second drive signal generation unit 922. As illustrated in FIG. 14, the monitor pulse signal Pm is a rectangular wave (square wave) signal obtained by binarizing the drive signal Sd to High and Low. A configuration of the monitor signal generation unit 96 is not limited in particular as long as the above-described monitor pulse signal Pm can be generated. The monitor signal generation unit 96 according to the present embodiment is configured to include a comparator 96A. According to the configuration, it is possible to determine whether or not a desirable drive signal Sd is generated from the drive pulse signal Pd, based on the monitor pulse signal Pm.

The phase difference acquisition unit 94 acquires the phase difference θ2, based on a center Pmc of rising and falling edges of the monitor pulse signal Pm and the center Psc of the rising and falling edges of the detection pulse signal Ps. As described above, since a source of the monitor pulse signal Pm is the drive pulse signal Pd, there is a correlation therebetween. Accordingly, even if the phase difference θ2 is acquired by using the monitor pulse signal Pm instead of the drive pulse signal Pd, the same effect as in the first embodiment described above can be obtained.

As such, the control device 9 of the piezoelectric drive device 1 according to the present embodiment is described. The control device 9 is a control device of the piezoelectric drive device 1 including the vibration body 11 that includes the piezoelectric elements 5A, 5B, 5C, 5D, and 5E (piezoelectric elements for drive) and the piezoelectric element 5F (piezoelectric element for detection), vibrates according to the drive of the piezoelectric elements 5A, 5B, 5C, 5D, and 5E, and outputs the detection signal Ss according to the vibration from the piezoelectric element 5F. The control device 9 includes the drive pulse signal generation unit 91 that generates a binary drive pulse signal Pd, the drive signal generation unit 92 that generates the drive signal Sd which is applied to the piezoelectric elements 5A, 5B, 5C, 5D, and 5E from the drive pulse signal Pd, the monitor pulse signal generation unit 96 that binarizes the drive signal Sd to generate the monitor pulse signal Pm, the detection pulse signal generation unit 93 that binarizes the detection signal Ss output from the piezoelectric element 5F to generate the detection pulse signal Ps, and the phase difference acquisition unit 94 that acquires the phase difference θ2 between the drive pulse signal Pd and the detection pulse signal Ps, based on the rising and falling edges of the monitor pulse signal Pm and the rising and falling edges of the detection pulse signal Ps. According to the configuration, the phase difference θ2 is not affected by the duty of the drive pulse signal Pd, and thus, it is possible to detect a vibration state of the vibration body 11 with high accuracy, regardless of the duty of the drive pulse signal Pd. Accordingly, it is possible to control drive of the piezoelectric drive device 1 with high accuracy.

In addition, as described above, the control method of the piezoelectric drive device 1 is a control method of the piezoelectric drive device 1 including the vibration body 11 that includes the piezoelectric elements 5A, 5B, 5C, 5D, and 5E (piezoelectric elements for drive) and the piezoelectric element 5F (piezoelectric element for detection), vibrates according to the drive of the piezoelectric elements 5A, 5B, 5C, 5D, and 5E, and outputs the detection signal Ss according to the vibration from the piezoelectric element 5F. In the control method, the binary drive pulse signal Pd is generated, the drive signal Sd which is applied to the piezoelectric elements 5A, 5B, 5C, 5D, and 5E is generated from the drive pulse signal Pd, the drive signal Sd is binarized to generate the monitor pulse signal Pm, the detection signal Ss output from the piezoelectric element 5F is binarized to generate the detection pulse signal Ps, and the phase difference θ2 between the drive pulse signal Pd and the detection pulse signal Ps is acquired based on the rising and falling edges of the monitor pulse signal Pm and the rising and falling edges of the detection pulse signal Ps. According to the control method, the phase difference θ2 is not affected by the duty of the drive pulse signal Pd, and thus, it is possible to detect a vibration state of the vibration body 11 with high accuracy, regardless of the duty of the drive pulse signal Pd. Accordingly, it is possible to control the drive of the piezoelectric drive device 1 with high accuracy.

According to the third embodiment described above, the same effect as in the first embodiment described above can also be obtained.

In the present embodiment, the phase difference acquisition unit 94 acquires the phase difference θ2 by using the same method as in the first embodiment except that the monitor pulse signal Pm is used instead of the drive pulse signal Pd, but the invention is not limited thereto, and the phase difference θ2 may be acquired by using the same method as in the second embodiment described above.

Fourth Embodiment

Next, a robot according to a fourth embodiment of the invention will be described.

Figure 15:
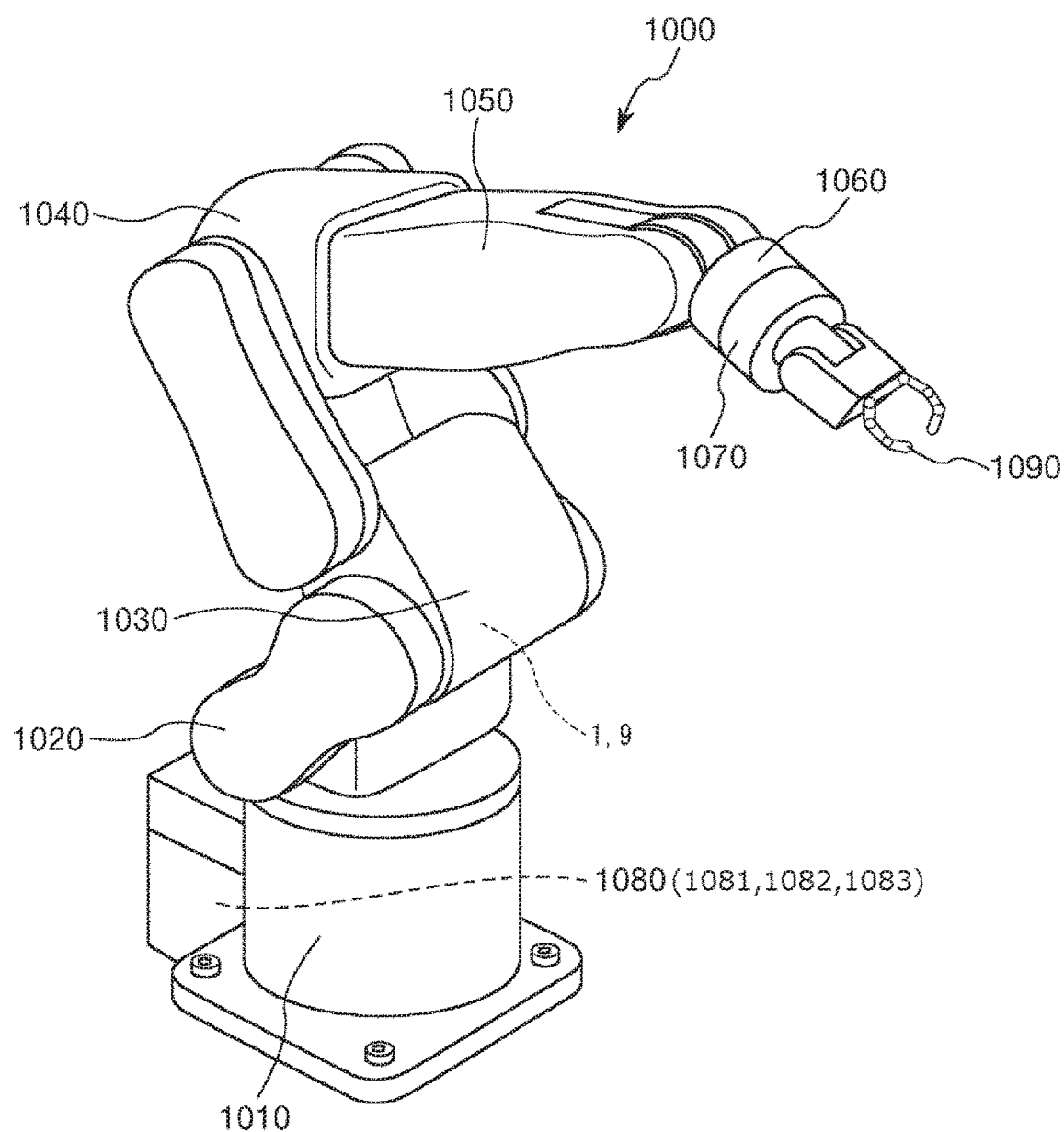
FIG. 15 is a perspective view illustrating a robot according to a fourth embodiment of the invention.

FIG. 15 is a perspective view illustrating the robot according to the fourth embodiment of the invention.

A robot 1000 illustrated in FIG. 15 can perform work such as material feeding, material removing, transport, and assembly of a precision apparatus and components configuring the precision apparatus. The robot 1000 is a six-axis robot, and includes a base 1010 fixed to a floor or a ceiling, an arm 1020 rotatably connected to the base 1010, an arm 1030 rotatably connected to the arm 1020, an arm 1040 rotatably connected to the arm 1030, an arm 1050 rotatably connected to the arm 1040, an arm 1060 rotatably connected to the arm 1050, an arm 1070 rotatably connected to the arm 1060, and a robot control device 1080 that controls drive of the arms 1020, 1030, 1040, 1050, 1060, and 1070.

In addition, a hand connection portion is provided on the arm 1070, and an end effector 1090 corresponding to the work to be performed by the robot 1000 is attached to the hand connection portion. In addition, the piezoelectric drive device 1 and the control device 9 are mounted on all or a part of each joint portion, and the respective arms 1020, 1030, 1040, 1050, 1060, and 1070 are rotated by the drive of the piezoelectric drive device 1. The piezoelectric drive device 1 and the control device 9 may be mounted on the end effector 1090 and may be used for driving the end effector 1090.

The robot control device 1080 is configured with a computer, and includes, for example, a processor 1081 (CPU), a memory 1082, an I/F 1083 (interface), and the like. The processor 1081 executes a predetermined program (code string) stored in the memory 1082, thereby controlling drive of each portion (particularly, the control device 9) of the robot 1000. The program may be downloaded from an external server via the I/F 1083. In addition, all or a part of the configuration of the robot control device 1080 may be provided outside the robot 1000 and may be configured to be connected via a communication network such as a local area network (LAN).

The robot 1000 includes the control device 9. Accordingly, it is possible to obtain the effect of the control device 9 described above and to exhibit high reliability.

Fifth Embodiment

Next, an electronic component transport apparatus according to a fifth embodiment of the invention will be described.

Figure 16:
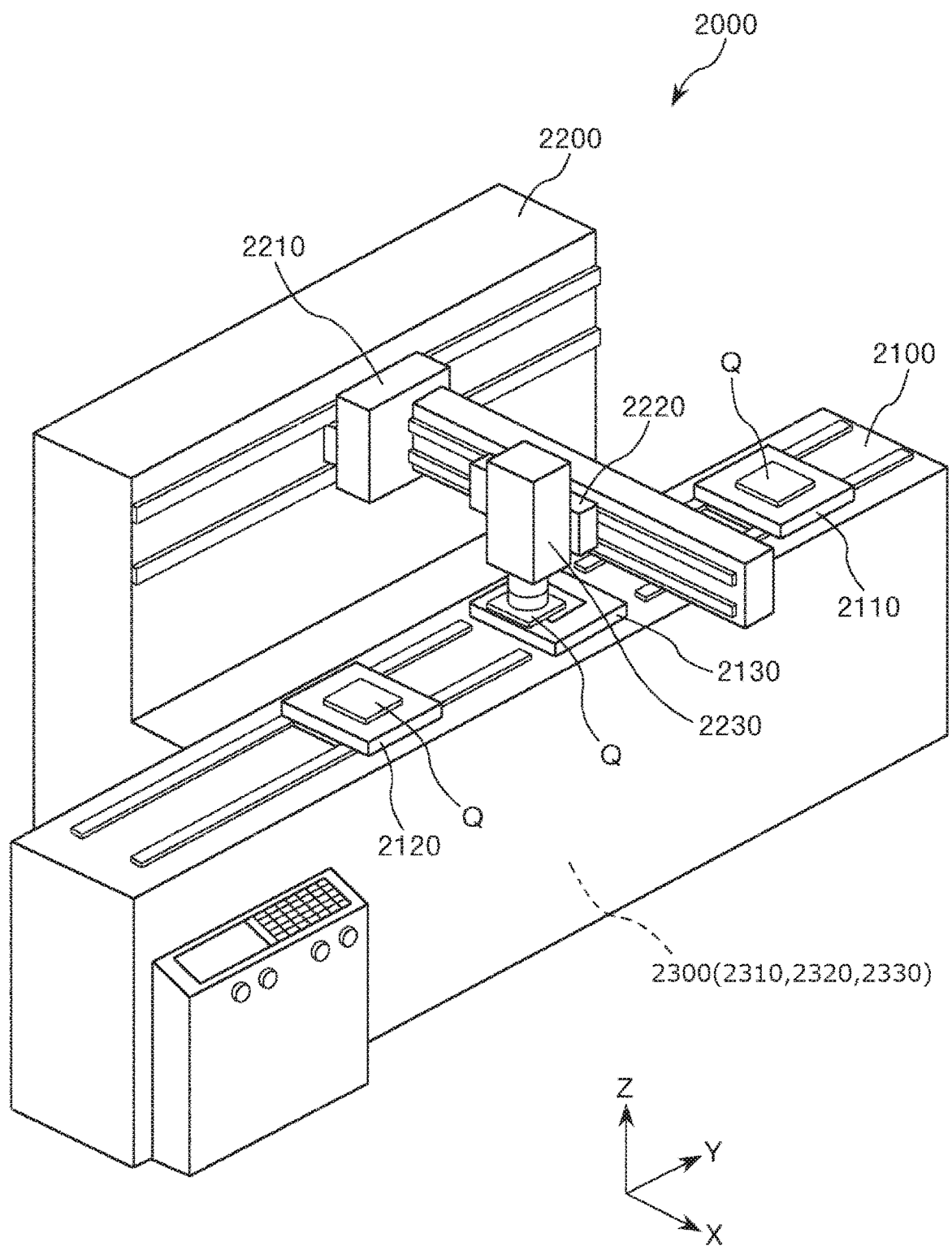
FIG. 16 is a perspective view illustrating an electronic component transport apparatus according to a fifth embodiment of the invention.
Figure 17:
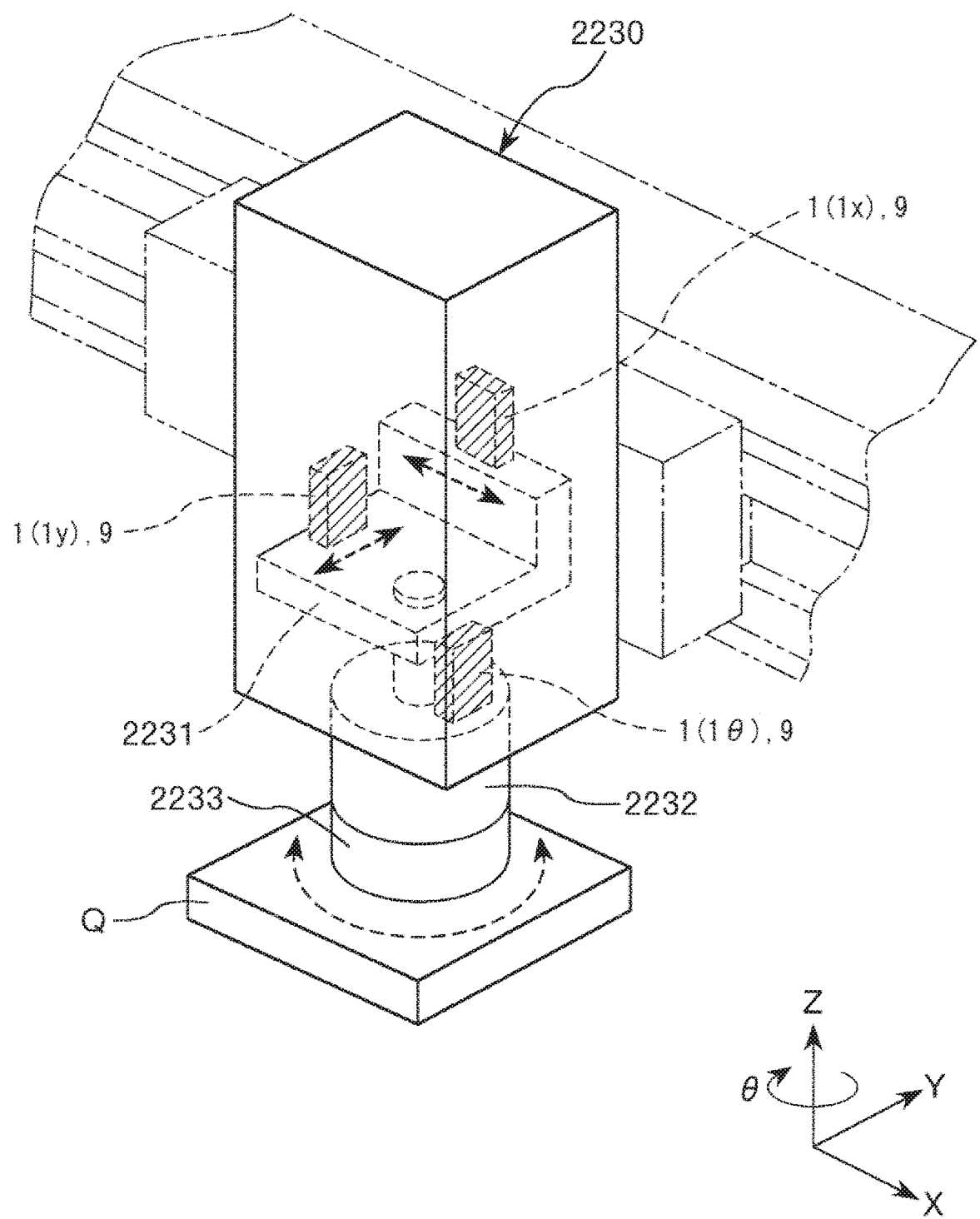
FIG. 17 is a perspective view illustrating an electronic component holding portion included in the electronic component transport apparatus illustrated in FIG. 16.

FIG. 16 is a perspective view illustrating the electronic component transport apparatus according to the fifth embodiment of the invention. FIG. 17 is a perspective view illustrating an electronic component holding portion included in the electronic component transport apparatus illustrated in FIG. 16. In the following description, three axes orthogonal to each other are referred to as an X-axis, a Y-axis, and a Z-axis for the sake of convenient description.

The electronic component transport apparatus 2000 illustrated in FIG. 16 is applied to an electronic component inspection device, and includes a base 2100, a support base 2200 disposed on a side of the base 2100, and a handler control device 2300 that controls drive of each portion. In addition, an upstream stage 2110 on which an electronic component Q to be inspected is placed and is transported in the Y-axis direction, a downstream stage 2120 on which the inspected electronic component Q is placed and is transported in the Y-axis direction, and an inspection table 2130 which is located between the upstream stage 2110 and the downstream stage 2120 and inspects electrical characteristics of the electronic component Q are provided on the base 2100. For example, the electronic component Q include a semiconductor, a semiconductor wafer, a display device such as a CLD or an OLED, a liquid crystal device, various sensors, an ink jet head, various MEMS devices, and the like.

In addition, A Y stage 2210 that is movable in the Y-axis direction with respect to the support base 2200 is provided on the support base 2200, an X stage 2220 that is movable in the X-axis direction with respect to the Y stage 2210 is provided on the Y stage 2210, and an electronic component holding portion 2230 that is movable in the Z-axis direction with respect to the X stage 2220 is provided on the X-stage 2220.

In addition, as illustrated in FIG. 17, the electronic component holding portion 2230 includes a fine adjustment plate 2231 that is movable in the X-axis direction and the Y-axis direction, a rotation portion 2232 that is rotatable around the Z-axis with respect to the fine adjustment plate 2231, and a holding portion 2233 that is provided in the rotation portion 2232 and holds the electronic component Q. In addition, a piezoelectric drive device 1 (1x) and a control device 9 for moving the fine adjustment plate 2231 in the X-axis direction, a piezoelectric drive device 1 (1y) and a control device 9 for moving the fine adjustment plate 2231 in the Y-axis direction, and a piezoelectric drive device 1 (1θ) and a control device 9 for rotating the rotation portion 2232 around the Z-axis are embedded in the electronic component holding portion 2230.

The handler control device 2300 is configured with a computer, and includes, for example, a processor 2310 (CPU), a memory 2320, an I/F 2330 (interface), and the like. The processor 2310 executes a predetermined program (code string) stored in the memory 2320, thereby controlling drive of each portion (particularly, the control device 9) of the electronic component transport apparatus 2000. The program may be downloaded from an external server via the I/F 2330. In addition, all or a part of the configuration of the handler control device 2300 may be provided outside the electronic component transport apparatus 2000 and is connected via a communication network such as a local area network (LAN) or the like.

The electronic component transport apparatus 2000 includes a control device 9. Accordingly, it is possible to obtain the effect of the control device 9 described above and to exhibit high reliability.

Sixth Embodiment

Next, a printer according to a sixth embodiment of the invention will be described.

Figure 18:
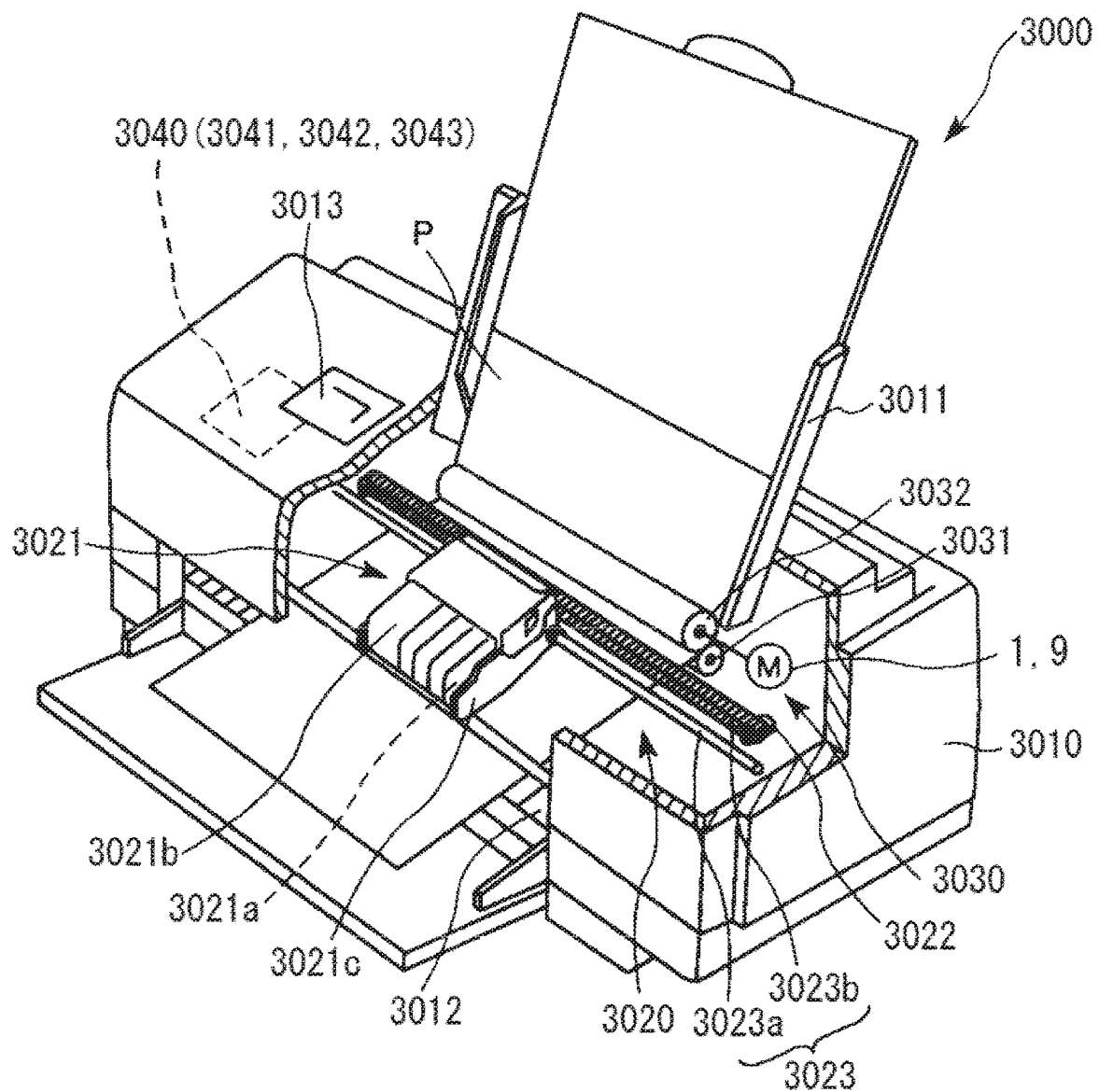
FIG. 18 is a schematic view illustrating an entire configuration of a printer according to a sixth embodiment of the invention.

FIG. 18 is a schematic view illustrating an entire configuration of the printer according to the sixth embodiment of the invention.

A printer 3000 illustrated in FIG. 18 includes an apparatus main body 3010, a print mechanism 3020 provided inside the apparatus main body 3010, a paper feeding mechanism 3030, and a printer control device 3040. In addition, the apparatus main body 3010 is provided with a tray 3011 for placing record paper P, a paper discharge port 3012 for discharging the record paper P, and an operation panel 3013 such as a liquid crystal display.

The print mechanism 3020 includes a head unit 3021, a carriage motor 3022, and a reciprocating mechanism 3023 for reciprocating the head unit 3021 by a driving force of the carriage motor 3022. In addition, the head unit 3021 includes a head 3021a which is an ink jet type recording head, an ink cartridge 3021b which supplies ink to the head 3021a, and a carriage 3021c on which the head 3021a and the ink cartridge 3021b are mounted.

The reciprocating mechanism 3023 includes a carriage guide shaft 3023a for supporting the carriage 3021c so as to be able to reciprocate, and a timing belt 3023b that moves the carriage 3021c on the carriage guide shaft 3023a by using the driving force of the carriage motor 3022. In addition, the paper feeding mechanism 3030 includes a driven roller 3031 and a driving roller 3032 that are in pressure contact with each other, and a piezoelectric drive device 1 and a control device 9 that drive the driving roller 3032.

In the printer 3000, the paper feeding mechanism 3030 intermittently feeds the record paper P one by one to the vicinity of a lower portion of the head unit 3021. At this time, the head unit 3021 reciprocates in a direction substantially orthogonal to the feeding direction of the record paper P, and printing on the record paper P is performed.

The printer control device 3040 is configured with a computer, and includes, for example, a processor 3041 (CPU), a memory 3042, an I/F 3043 (interface), and the like. The processor 3041 executes a predetermined program (code string) stored in the memory 3042, thereby controlling drive of each portion (particularly, the control device 9) of the printer 3000. Such a control is performed, for example, based on print data input from a host computer such as a personal computer via the I/F 3043. The program may be downloaded from an external server via the I/F 3043. In addition, all or a part of a configuration of the printer control device 3040 may be provided outside the printer 3000 and may be configured to be connected via a communication network such as a local area network (LAN) or the like.

The printer 3000 includes a control device 9. Accordingly, it is possible to obtain the effect of the control device 9 described above and to exhibit high reliability. In the present embodiment, the piezoelectric drive device 1 and the control device 9 drive the driving roller 3032 for feeding, but may drive the carriage 3021c in addition to that.

Seventh Embodiment

Next, a projector according to a seventh embodiment of the invention will be described.

Figure 19:
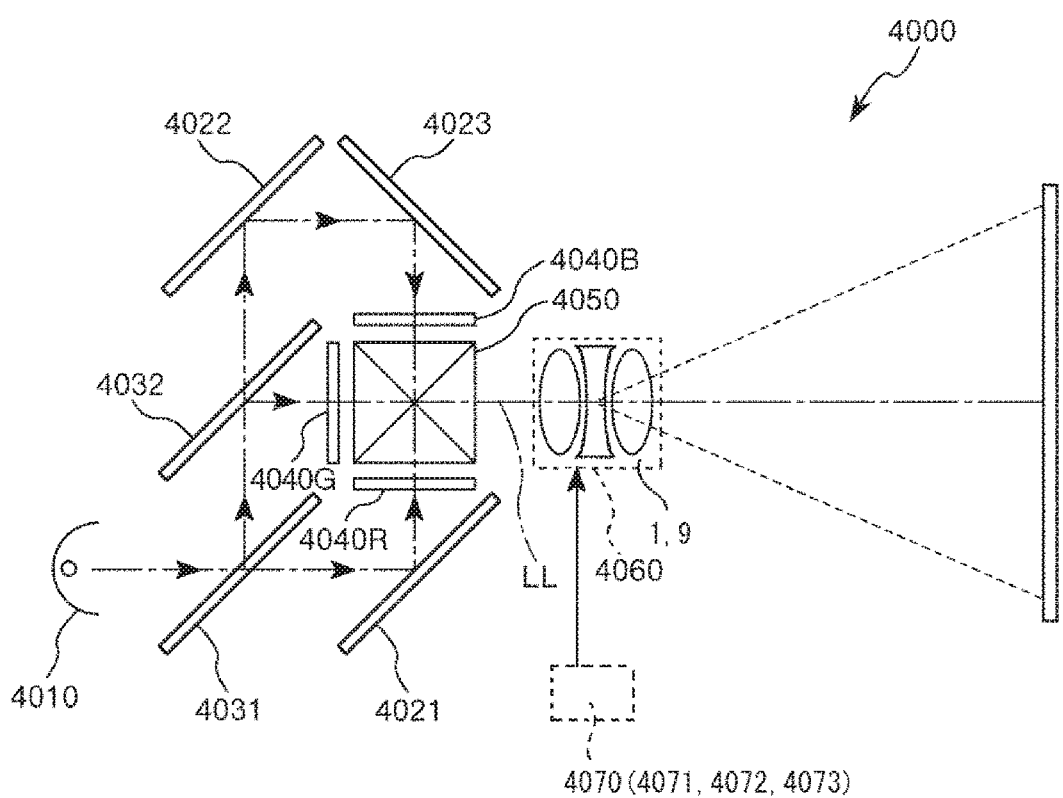
FIG. 19 is a schematic diagram illustrating an entire configuration of a projector according to a seventh embodiment of the invention.

FIG. 19 is a schematic diagram illustrating an entire configuration of the projector according to the seventh embodiment of the invention.

A projector 4000 illustrated in FIG. 19 is an LCD type projector and includes a light source 4010, mirrors 4021, 4022, and 4023, dichroic mirrors 4031 and 4032, liquid crystal display elements 4040R, 4040G, and 4040B, a dichroic prism 4050, a projection lens system 4060, and a projector control device 4070.

The light source 4010 includes, for example, a halogen lamp, a mercury lamp, a light emitting diode (LED), and the like. In addition, a light source that emits white light is used as the light source 4010. The light emitted from the light source 4010 is first separated into red light (R) and the other light by the dichroic mirror 4031. After being reflected by the mirror 4021, the red light is incident on the liquid crystal display element 4040R, and the other light is further separated into green light (G) and blue light (B) by the dichroic mirror 4032. The green light is incident on the liquid crystal display element 4040G, and the blue light is reflected by the mirrors 4022 and 4023 and then incident on the liquid crystal display element 4040B.

Each of the liquid crystal display elements 4040R, 4040G, and 4040B is used as a spatial light modulator. The liquid crystal display elements 4040R, 4040G, and 4040B are transmissive spatial light modulators corresponding to the primary colors of R, G, and B, respectively, and include pixels arranged in a matrix of, for example, 1080 rows in the vertical direction and 1920 columns in the horizontal direction. In each pixel, the amount of transmitting light with respect to incident light is adjusted, and a light amount distribution of all the pixels is cooperatively controlled in each of the liquid crystal display elements 4040R, 4040G, and 4040B. The light spatially modulated by the liquid crystal display elements 4040R, 4040G, and 4040B is synthesized by the dichroic prism 4050, and full color image light LL is emitted from the dichroic prism 4050. The emitted image light LL is enlarged by the projection lens system 4060 and is projected onto, for example, a screen or the like. The projector 4000 uses the piezoelectric drive device 1 so as to change a focal length by moving at least one lens included in the projection lens system 4060 in the optical axis direction.

The projector control device 4070 is configured with a computer, and includes, for example, a processor 4071 (CPU), a memory 4072, an I/F 4073 (interface), and the like. The processor 4071 executes a predetermined program (code string) stored in the memory 4072, thereby controlling drive of each portion (particularly, the control device 9) of the projector 4000. The program may be downloaded from an external server via the I/F 4073. In addition, all or a part of a configuration of the projector control device 4070 may be provided outside the projector 4000 and may be configured to be connected via a communication network such as a local area network (LAN) or the like.

The projector 4000 includes a control device 9. Accordingly, it is possible to obtain the effect of the control device 9 described above and to exhibit high reliability.

As such, although the control device of the piezoelectric drive device and the control method of the piezoelectric drive device according to the invention are described based on the illustrated embodiments, the invention is not limited to this, and configurations of each portion can be replaced with any configuration having the same function. In addition, any other configuration may be added to the invention. In addition, the respective embodiments may be appropriately combined to each other.

In addition, in the above-described embodiments, the configurations are described in which the control device (control method) according to the invention is applied to a piezoelectric motor, a robot, an electronic component transport apparatus, a printer, and a projector, but the control device is also applicable to various electronic devices other than those.

The entire disclosure of Japanese Patent Application No. 2017-191088, filed Sep. 29, 2017 is expressly incorporated by reference herein.

What is claimed is:

1. A control device of a piezoelectric drive device including a vibration body that includes a piezoelectric element for drive and a piezoelectric element for detection, vibrates according to drive of the piezoelectric element for drive, and outputs a detection signal according to the vibration from the piezoelectric element for detection, the control device comprising:
   a drive pulse signal generation unit that generates a binary drive pulse signal;
   a drive signal generation unit that generates a drive signal which is applied to the piezoelectric element for drive from the binary drive pulse signal;
   a detection pulse signal generation unit that generates a detection pulse signal by binarizing the detection signal which is output from the piezoelectric element for detection; and
   a phase difference acquisition unit that acquires a phase difference between the binary drive pulse signal and the detection pulse signal, based on a rising edge and a falling edge of the binary drive pulse signal and a rising edge and a falling edge of the detection pulse signal.

2. The control device of a piezoelectric drive device according to claim 1,
   wherein the phase difference acquisition unit acquires the phase difference, based on a center of the rising and falling edges of the binary drive pulse signal and a center of the rising and falling edges of the detection pulse signal.

3. The control device of a piezoelectric drive device according to claim 1, further comprising:
   a drive control unit that controls drive of the drive pulse signal generation unit, based on the phase difference which is acquired by the phase difference acquisition unit.

4. A control device of a piezoelectric drive device including a vibration body that includes a piezoelectric element for drive and a piezoelectric element for detection, vibrates according to drive of the piezoelectric element for drive, and outputs a detection signal according to the vibration from the piezoelectric element for detection, the control device comprising:
   a drive pulse signal generation unit that generates a binary drive pulse signal;
   a drive signal generation unit that generates a drive signal which is applied to the piezoelectric element for drive from the binary drive pulse signal; a detection pulse signal generation unit that generates a detection pulse signal by binarizing the detection signal which is output from the piezoelectric element for detection; and
   a phase difference acquisition unit that acquires a phase difference between the binary drive pulse signal and the detection pulse signal, based on a duty of the binary drive pulse signal, a rising edge or a falling edge of the binary drive pulse signal, and a rising edge or a falling edge of the detection pulse signal.

5. The control device of a piezoelectric drive device according to claim 4,
   wherein the phase difference acquisition unit acquires the phase difference, based on a center of the rising and falling edges of the binary drive pulse signal that is predicted based on the duty of the binary drive pulse signal and the rising edge or the falling edge of the binary drive pulse signal, and a center of the rising and falling edges of the detection pulse signal that is predicted based on the rising edge or the falling edge of the detection pulse signal.

6. The control device of a piezoelectric drive device according to claim 4, further comprising:
   a drive control unit that controls drive of the drive pulse signal generation unit, based on the phase difference which is acquired by the phase difference acquisition unit.

7. The control method of a piezoelectric drive device according to claim 6,
   wherein the phase difference is acquired based on a center of the rising and falling edges of the binary drive pulse signal and a center of the rising and falling edges of the detection pulse signal.

8. A control device of a piezoelectric drive device including a vibration body that includes a piezoelectric element for drive and a piezoelectric element for detection, vibrates according to drive of the piezoelectric element for drive, and outputs a detection signal according to the vibration from the piezoelectric element for detection, the control device comprising:
   a drive pulse signal generation unit that generates a binary drive pulse signal;
   a drive signal generation unit that generates a drive signal which is applied to the piezoelectric element for drive from the binary drive pulse signal;
   a monitor pulse signal generation unit that generates a monitor pulse signal by binarizing the drive signal;
   a detection pulse signal generation unit that generates a detection pulse signal by binarizing the detection signal which is output from the piezoelectric element for detection; and
   a phase difference acquisition unit that acquires a phase difference between the binary drive pulse signal and the detection pulse signal, based on a rising edge and a falling edge of the monitor pulse signal and a rising edge and a falling edge of the detection pulse signal.

9. The control device of a piezoelectric drive device according to claim 8, further comprising:
   a drive control unit that controls drive of the drive pulse signal generation unit, based on the phase difference which is acquired by the phase difference acquisition unit.

10. A control method of a piezoelectric drive device including a vibration body that includes a piezoelectric element for drive and a piezoelectric element for detection, vibrates according to drive of the piezoelectric element for drive, and outputs a detection signal according to the vibration from the piezoelectric element for detection, the control method comprising:

generating a binary drive pulse signal;

generating a drive signal which is applied to the piezoelectric element for drive from the binary drive pulse signal;

generating a detection pulse signal by binarizing the detection signal which is output from the piezoelectric element for detection; and acquiring a phase difference between the binary drive pulse signal and the detection pulse signal, based on a rising edge and a falling edge of the binary drive pulse signal and a rising edge and a falling edge of the detection pulse signal.

11. The control method of a piezoelectric drive device according to claim 10, wherein the phase difference is acquired based on a center of the rising and falling edges of the binary drive pulse signal that is predicted based on the duty of the binary drive pulse signal and the rising edge or the falling edge of the binary drive pulse signal, and a center of the rising and falling edges of the detection pulse signal that is predicted based on the rising edge or the falling edge of the detection pulse signal.

12. The control method of a piezoelectric drive device according to claim 10, wherein the binary drive pulse signal is generated based on the phase difference.

13. A control method of a piezoelectric drive device including a vibration body that includes a piezoelectric element for drive and a piezoelectric element for detection, vibrates according to drive of the piezoelectric element for drive, and outputs a detection signal according to the vibration from the piezoelectric element for detection, the control method comprising:

generating a binary drive pulse signal;

generating a drive signal which is applied to the piezoelectric element for drive from the binary drive pulse signal;

generating a detection pulse signal by binarizing the detection signal which is output from the piezoelectric element for detection; and acquiring a phase difference between the binary drive pulse signal and the detection pulse signal, based on a duty of the binary drive pulse signal, a rising edge or a falling edge of the binary drive pulse signal, and a rising edge or a falling edge of the detection pulse signal.

14. The control method of a piezoelectric drive device according to claim 13, wherein the binary drive pulse signal is generated based on the phase difference.

15. A control method of a piezoelectric drive device including a vibration body that includes a piezoelectric element for drive and a piezoelectric element for detection, vibrates according to drive of the piezoelectric element for drive, and outputs a detection signal according to the vibration from the piezoelectric element for detection, the control method comprising:

generating a binary drive pulse signal;

generating a drive signal which is applied to the piezoelectric element for drive from the binary drive pulse signal;

generating a monitor pulse signal by binarizing the drive signal;

generating a detection pulse signal by binarizing the detection signal which is output from the piezoelectric element for detection; and acquiring a phase difference between the binary drive pulse signal and the detection pulse signal, based on a rising edge and a falling edge of the monitor pulse signal and a rising edge and a falling edge of the detection pulse signal.

16. The control method of a piezoelectric drive device according to claim 15, wherein the binary drive pulse signal is generated based on the phase difference.

* * * * *